US008184139B2

(12) United States Patent
Nagumo

(10) Patent No.: US 8,184,139 B2
(45) Date of Patent: May 22, 2012

(54) REDUNDANCE CONTROL OF TEMPERATURE COMPENSATION FOR A LED PRINTHEAD

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 915 days.

(21) Appl. No.: 12/232,583

(22) Filed: Sep. 19, 2008

(65) Prior Publication Data

US 2009/0079364 A1    Mar. 26, 2009

(30) Foreign Application Priority Data

Sep. 20, 2007 (JP) .................. 2007-243255

(51) Int. Cl.
*B41J 2/35* (2006.01)
*B41J 2/435* (2006.01)
*B41J 2/47* (2006.01)
*G01R 19/00* (2006.01)
*G11C 7/00* (2006.01)
*H03F 3/45* (2006.01)
*H03K 4/06* (2006.01)
*H03K 3/42* (2006.01)
*H03K 17/78* (2006.01)
*H01L 35/00* (2006.01)

(52) U.S. Cl. .......... 347/237; 347/211; 347/247; 327/55; 327/132; 327/512

(58) Field of Classification Search .................. 347/211, 347/237, 247; 327/55, 132, 512
See application file for complete search history.

(56) References Cited

U.S. PATENT DOCUMENTS

| 4,952,949 | A | * | 8/1990 | Uebbing | 347/237 |
| 5,126,759 | A | * | 6/1992 | Small et al. | 347/237 |
| 5,138,310 | A | * | 8/1992 | Hirane et al. | 345/82 |
| 5,467,036 | A | * | 11/1995 | Sawada | 327/108 |
| 5,815,025 | A | * | 9/1998 | Kubota | 327/514 |
| 5,892,532 | A | * | 4/1999 | Katakura et al. | 347/240 |
| 6,028,472 | A | * | 2/2000 | Nagumo | 327/512 |
| 6,388,695 | B1 | * | 5/2002 | Nagumo | 347/237 |
| 6,477,090 | B2 | * | 11/2002 | Yamaki et al. | 365/189.09 |
| 6,529,229 | B2 | * | 3/2003 | Nagumo | 347/237 |
| 6,547,359 | B2 | * | 4/2003 | Fukano | 347/17 |
| 2008/0166149 | A1 | * | 7/2008 | Nagumo | 399/51 |

FOREIGN PATENT DOCUMENTS

JP    10-332494    12/1998

* cited by examiner

*Primary Examiner* — Laura Martin
*Assistant Examiner* — Jeremy Bishop
(74) *Attorney, Agent, or Firm* — Rabin & Berdo, P.C.

(57) ABSTRACT

A driving apparatus having driving circuits formed to correspond to driven circuits arranged on a circuit board. Each driving circuit includes a driving control unit for driving the corresponding driven circuit, a reference voltage generation unit for generating a reference voltage according to a temperature of the corresponding driven circuit, a control voltage generation unit for generating, based on the reference voltage supplied from the reference voltage generation unit, a control voltage for driving the corresponding driven circuit, the control voltage generation unit supplying the generated control voltage to the driving control unit, a switch device formed between the control voltage generation unit and the reference voltage generation unit, and a switch control unit for driving the switch device based on an inputted control signal. The control voltage generation unit is connected to the reference voltage generation unit of another of the driving circuits via the switch device.

16 Claims, 26 Drawing Sheets

REDUNDANCE CONTROL OF TEMPERATURE COMPENSATION FOR A LED PRINTHEAD

BACKGROUND OF THE INVENTION

1. Field of the Invention

The present invention relates to a driving device, a driving circuit, an LED head, and an image forming apparatus.

2. Description of Related Art

Japanese Patent Application Publication No. H10-332494 is known that discloses a technology relating to a driving device for driving a driven device such as an LED array and the like.

Specifically, Japanese Patent Application Publication No. H10-332494 discloses a driving device that has driving circuits having temperature compensation circuits and decoupling capacitors respectively connected to the driving circuits, so that the driving device reduces a noise voltage. More specifically, the temperature compensation circuit detects a temperature by using base-emitter voltages of two bipolar transistors whose size are different from each other. A reference voltage is calculated by making use of a fact that a difference between the base-emitter voltages of the two bipolar transistors is proportional to a thermal voltage $V_T$. The driving device drives the driven device by supplying the calculated reference voltage to the driven device. The thermal voltage $V_T$ is such extremely low signal level, approximately 26 mV at room temperature. Accordingly, the driving device gets rid of the effect caused by the minute noise voltage occurring within the driving circuit by arranging the decoupling capacitor connected to each of the driving circuits, thus reducing the influence caused by the noise voltage.

In a case where the driving circuit having the temperature compensation circuit as described above is used, however, a reference voltage used to drive the driven device is calculated for each of the driven devices. That is, the conventional technology requires the decoupling capacitors to be connected to all of the driving circuits because temperature compensation processing needs to be processed for each of the driving circuits. Taking an LED head as an example, a conventionally used LED head 601 as shown in FIG. 26 has an LED array consisting of a combination of twenty six pieces of LED array chips as driven devices arranged on a prescribed circuit board, and also has a driving circuit IC1, IC2, . . . , IC26 arranged to correspond to the LED array chips. Furthermore, the LED head 601 has decoupling capacitors 605, 607, . . . , 657 corresponding to driving circuits IC1, IC2, . . . , IC26, respectively. The decoupling capacitors 605, 607, . . . , 657 are connected to the driving circuits IC1, IC2, . . . , IC26, respectively, arranged in proximity to the corresponding decoupling capacitors. Each of the decoupling capacitors gets rid of the noise voltage caused by the corresponding temperature compensation circuit.

In a case where the driving device as structured above is used, multiple decoupling capacitors are needed to be used, and there exists a problem that the cost of the driving device greatly increases. As shown in FIG. 26, the circuit board formed in a substantially rectangular shape has an L2 length in the short side. However, in a case where the decoupling capacitors are arranged in proximity to the driving circuits IC1, IC2, . . . , IC26, the length L2 of the short side of the circuit board is required to be more than a certain length. This causes the entire driving apparatus to become large and makes it difficult to downsize the driving device.

SUMMARY OF THE INVENTION

This invention is made in view of these circumstances, and it is the object of the present invention to provide a driving device, a driving circuit, an LED head, and an image forming apparatus capable of suppressing the noise voltage, capable of downsizing the entire driving device, and capable of reducing the manufacturing cost.

To alleviate the above problems, one aspect of a driving apparatus of the present invention has a plurality of driving circuits formed to correspond to a plurality of driven circuits arranged on a predetermined circuit board, each of the plurality of driving circuits including a driving control unit for driving the corresponding driven circuit, a reference voltage generation unit for generating a reference voltage according to a temperature of the corresponding driven circuit, a control voltage generation unit for generating, based on the reference voltage supplied from the reference voltage generation unit, a control voltage for driving the corresponding driven circuit, the control voltage generation unit supplying the generated control voltage to the driving control unit, a switch device formed between the control voltage generation unit and the reference voltage generation unit, and a switch control unit for driving the switch device based on an inputted control signal, wherein the control voltage generation unit is connected to the reference voltage generation unit of another of the plurality of driving circuits via the switch device.

According to the control signal inputted to the switch device, the driving apparatus can select one of the reference generation units of the plurality of deriving circuits, and the selected reference voltage generation unit generates the reference voltage to be supplied to each of the driving circuits. That is, the driving apparatus can supply the reference voltage generated in one of the driving circuits to other driving circuits. Furthermore, a noise suppressing processing is performed on the selected reference voltage generation unit, and accordingly, the driving apparatus of the present invention can prevent a noise voltage from occurring in the driven circuits.

To alleviate the above problems, another aspect of a driving circuit of the present invention has a driving control unit for driving a driven device, a reference voltage generation unit for generating a reference voltage according to a temperature of the driven device, a control voltage generation unit for generating a control voltage for driving the driven device based on the reference voltage supplied by the reference voltage generation unit or based on an externally-supplied reference voltage, the control voltage generation unit supplying the generated control voltage to the driving control unit, a switch device formed between the control voltage generation unit and the reference voltage generation unit, and a switch control unit for driving the switch device based on an inputted control signal, wherein the control voltage generation unit is connected to a supplier of the externally-supplied reference voltage via the switch device.

According to whether the switch device is conductive or non-conductive, the control voltage generation unit can generate the control voltage based on either of the reference voltage generated by the reference voltage generation unit within the driving circuit or the reference voltage supplied form the external supplier. Furthermore, the noise suppressing processing is performed on the reference voltage generation unit or the external supplier of the reference voltage, and accordingly, the driving circuit of the present invention can prevent the noise voltage from occurring in the driven devices.

Thus, the present invention suppresses the noise voltage occurring in the driving apparatus, and achieves to make the entire driving apparatus smaller and to reduce the production cost.

DETAILED DESCRIPTION OF THE DRAWINGS

This invention may take physical form in certain parts and arrangements of parts, a preferred embodiment and method of which will be described in detail in this specification and illustrated in the accompanying drawings which form a part hereof, and wherein.

PREFERRED EMBODIMENTS

A specific embodiment to which the present invention is applied will be hereinafter described in detail with reference to the figures.

In an LED head serving as a driving device for a printer according to the first embodiment, each of multiple driving circuits has a reference voltage generation unit functioning as a temperature compensation circuit. The reference voltage generation units in the multiple driving circuits are connected with each other. At least one of the multiple driving circuits is connected to a decoupling capacitor, and the reference voltage generated in the driving circuit connected to the decoupling capacitor is supplied to the remaining driving circuits. The remaining driving circuits drive LED devices based on the supplied reference voltage.

The structure of the printer as described above will be hereinafter described in detail.

Figure 1:
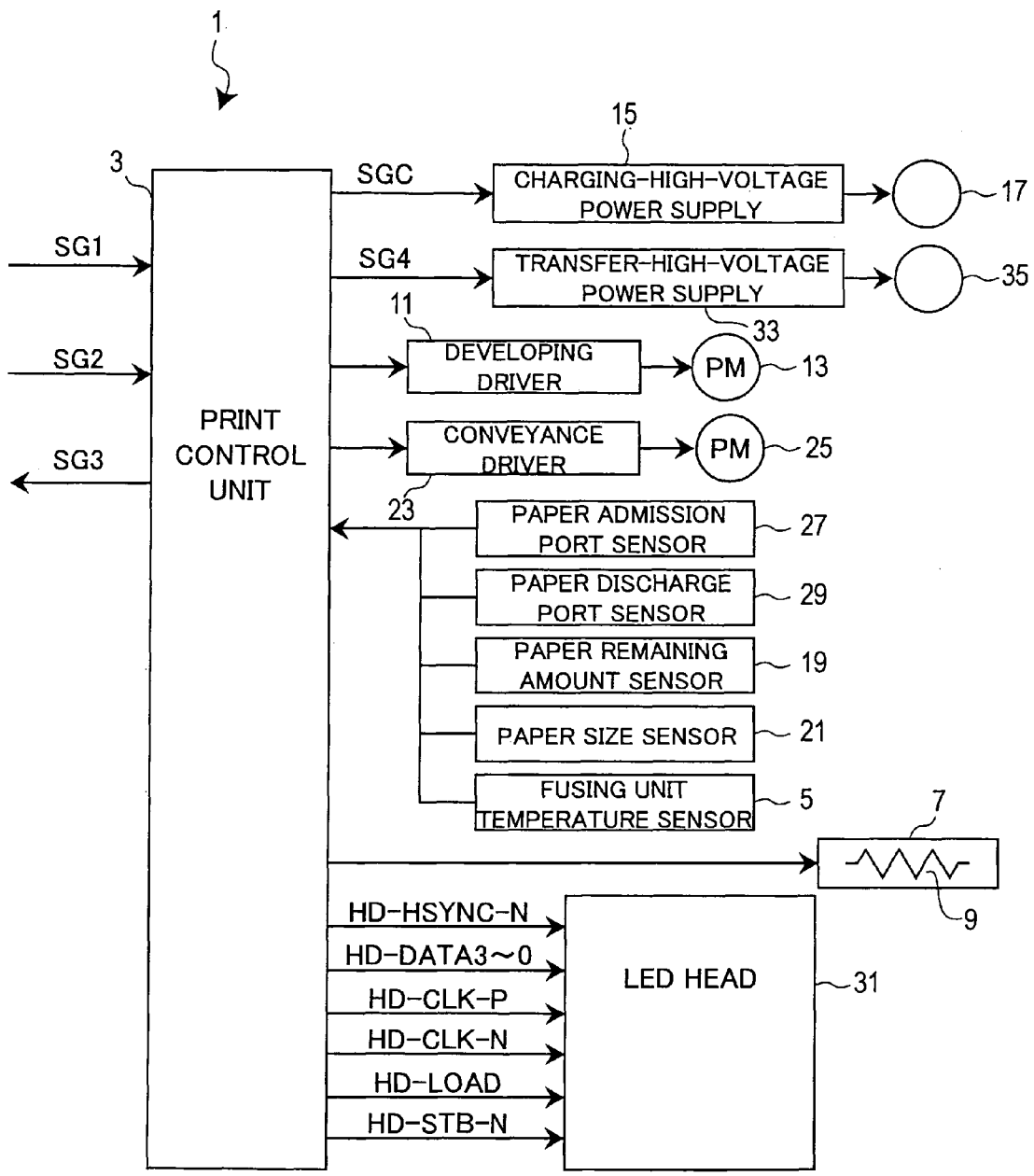
FIG. 1 is a block diagram of a printer according to the first embodiment.

As shown in FIG. 1, the printer 1 has a print control unit 3 performing a sequence control of the entire printer 1. The print control unit 3 controls operation of the printer 1 based on a control signal SG1 transmitted from a host controller, not shown, and also based on a video signal SG2 consisting of dot map data arranged one-dimensionally. Specifically, when the control signal SG1 is inputted to the print control unit 3, the print control unit 3 makes a determination, based on a detection result of a fixing unit temperature sensor 5, as to whether a fixing unit 7 is within a usable temperature range. Then, in a case where a surface temperature of the fixing unit 7 has not yet reached a temperature at which fixing can be performed, a heater 9 in the fixing unit 7 is turned on to heat the fixing unit 7. After the fixing unit 7 reaches the temperature at which the fixing can be performed, the print control unit 3 causes a developing driver 11 to begin to drive a developing/transferring process motor 13 to drive developing rollers and the like, not shown. Simultaneously with this, the print control unit 3 provides a charge signal SGC to a charging-high-voltage power supply 15 that charges a charging roller and a photosensitive drum, not shown. Thus, the charging-high-voltage power supply 15 charges a developing device 17 by generating a high voltage.

The print control unit 3 uses a paper remaining amount sensor 19 and a paper size sensor 21 to detect the remaining amount and the size of sheets of paper in a stacker, not shown, and select the paper corresponding to inputted print data. The print control unit 3 causes a conveyance driver 23 to drive a paper conveyance motor 25, thus starting conveying the selected paper. The print control unit 3 monitors a conveyance condition of the paper based on a detection result of a paper admission port sensor 27 and a paper discharge port sensor 29 arranged on a paper conveyance route.

When a sheet of paper reaches a position at which the sheet can be printed, the print control unit 3 transmits to a host controller a timing signal SG3 consisting of a main scanning synchronization signal and a sub-scanning synchronization signal. In response, the host controller inputs the video signal SG2 to the print control unit 3. Then, the print control unit 3 inputs the inputted video signal SG2 as four-bit width print data signals HD-DATA 3 to 0 into an LED head 31, serving as a driving device. In addition to the print data signals HD-DATA 3 to 0, the print control unit 3 consecutively inputs into the LED head 31 a main scanning synchronization signal HD-HSYNC-N, small amplitude differential signals HD-CLK-P, HD-CLK-N, a latch signal HD-LOAD, and a strobe signal HD-STB-N. Thus, the print control unit 3 performs a control to drive the LED head 31. Specifically, the print control unit 3 inputs the print data signals HD-DATA 3 to 0 for each of the print lines into the LED head 31. When the print data signal HD-DATA 3 to 0 are inputted into the LED head 31, the LED head 31 drives the LED array according to the inputted print data signals HD-DATA 3 to 0. Then, when the light of the LED array is emitted to the photosensitive drum charged to a negative potential, the potential in an area exposed to the light increases and becomes electrostatic latent dots. The printer 1 forms a toner image on the surface of the photosensitive drum by attaching toner to the electrostatic latent dots. Thereafter, the print control unit 3 inputs a transfer signal 4 into a transfer-high-voltage power supply 33, so that a transfer device 35 is charged to a positive potential. Then, the print control unit 3 causes the conveyed sheet of paper to pass between the transfer device 35 and the photosensitive drum, so that a toner image is transferred onto the sheet of paper. The sheet of paper having the toner imaged transferred thereon is conveyed to the fixing unit 7, and the fixing unit 7 fuses and fixes the toner image transferred onto the sheet of paper. In this way, the printer 1 repeats the operations as described above to print images on the sheets of paper.

Figure 2:
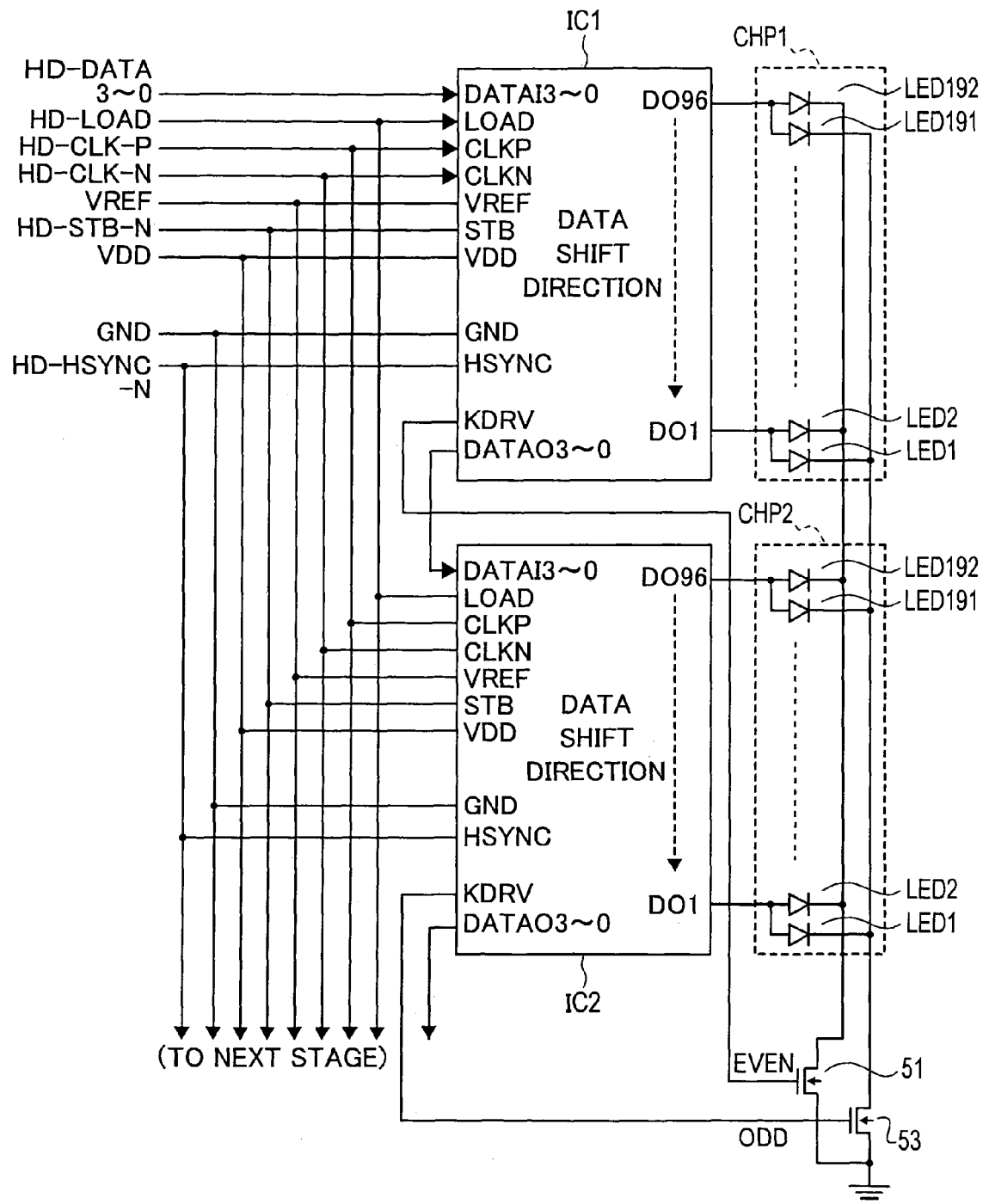
FIG. 2 is a block diagram of an LED head of the printer.

The structure of the LED head 31 will be hereinafter described in detail with reference to FIG. 2. For the sake of convenience of explanation, it is assumed in the below description that the printer 1 prints on an A4 size sheet of paper at 600 dpi (Dot Per Inch) resolution.

The LED head 31 consists of 26 pieces of LED arrays CHP1, CHP2, ..., CHP26, arranged in series. Each of the LED arrays chips consists of one hundred and ninety two (192) pieces of LED devices. Among the LED devices constituting the LED arrays CHP1, CHP2, ..., CHP26 in the LED head 31, all of the cathodes of the LED devices arranged at odd-numbered positions in a data shift direction are connected with each other, and furthermore, all of the cathodes of the LED devices arranged at even-numbered positions in a data shift direction are connected with each other. The LED head 31 time-divisionally drives the LED devices at odd-numbered positions and the LED devices at even numbered positions by driving a power MOS transistor 51 connected to the cathodes of the LED devices at odd-numbered positions and a power MOS transistor 53 connected to the cathodes of the LED devices at even-numbered positions The LED arrays CHP1, CHP2, ..., CHP26 are driven based on driving signals inputted from 26 pieces of drivers IC1, IC2, ..., IC26, serving as a driving circuit, that are arranged to correspond to the LED arrays CHP1, CHP2, ..., CHP26, respectively. Based on the print data signals HD-DATA 3 to 0 inputted from the print control unit 3, the drivers IC1, IC2, ..., IC26 input the driving signals into the corresponding LED arrays CHP1, CHP2, ..., CHP26, respectively, to drive the LED devices. The drivers IC1, IC2, ..., IC26 as described above consist of a substantially identical circuit. Each of the driver IC's is connected to the adjacent driver IC in cascade. Among the 26 pieces of the drivers IC1, IC2, ..., IC26, arranged in series, the driver IC1 and the driver IC2 on upstream side have KDRV terminals connected to gates of power MOS transistors 51, 53, respectively. The driver IC1 and the driver IC2 drive the Power MOS transistors 51, 53 by outputting gate signals EVEN, ODD from the KDRV terminals according to a later-described method, thereby time-divisionally driving the LED devices whose cathodes are connected in common. The structure of the drivers IC1, IC2, ..., IC26 will be hereinafter described in detail, but are collectively referred to as "the driver IC" in the below description for the sake of convenience.

Figure 3:
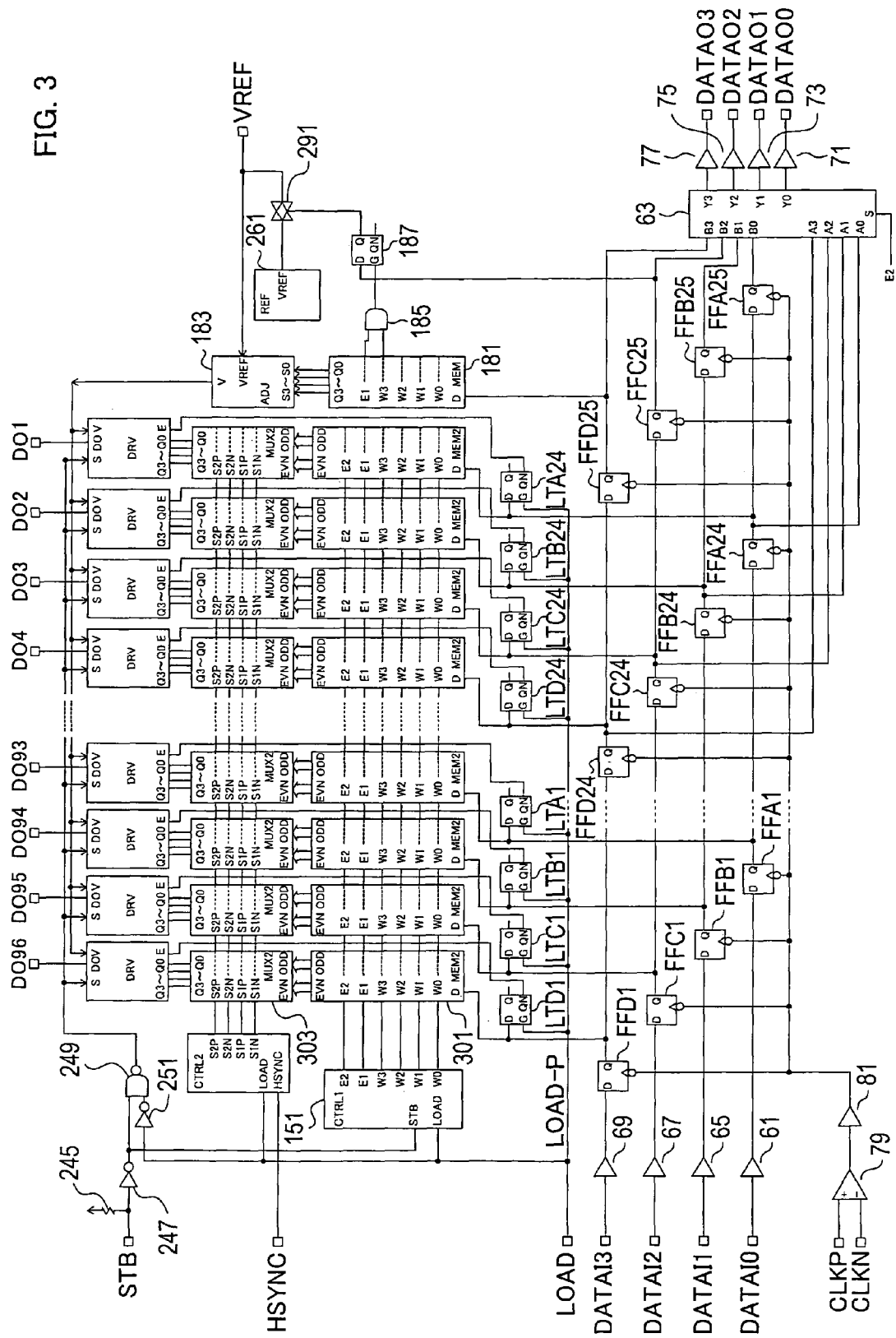
FIG. 3 is a circuit diagram of a driver IC of the LED head.

As shown in FIG. 3, the driver IC is made by connecting shift registers consisting of flip flop circuits, latch circuits, memory cell circuits MEM2, multiplexers MUX2, driving circuits DRV for the LED devices LED1, LED2, ..., LED192.

The shift registers cause the print data signal HD-DATA 3 to 0 inputted via input terminals DATAI 3-0 to shift stepwise. The shift register as described above has flip flop circuits FFA1, FFA2, ..., FFA25 into which the print data signal HD-DATA0 is inputted, flip flop circuits FFB1, FFB2, ..., FFB25 into which the print data signal HD-DATA1 is inputted, flip flop circuits FFC1, FFC2, ..., FFC25 into which the print data signal HD-DATA2 is inputted, and flip flop circuits FFD1, FFD2, ..., FFD25 into which the print data signal HD-DATA3 is inputted. The print data signal HD-DATA0 is inputted via a delay circuit 61 into the input terminal D of the flip flop circuit FFA1 formed at the first stage, among the flip flop circuits FFA1, FFA2, ..., FFA25 constituting the shift register as described above. Among the flip flop circuits FFA1, FFA2, ..., FFA25, the output terminal Q of the flip flop circuit FFA25 formed at the last stage is connected to the input terminal B0 of a selector circuit 63. Among the flip flop circuits FFA1, FFA2, ..., FFA25, the output terminal Q of the flip flop circuit 24 at the second to the last stage is connected to the input terminal D of the flip flop terminal FFA25 at the subsequent stage, and is also connected to the input terminal A0 of the selector circuit 63. Regarding the remaining flip flop circuits, the flip flop circuits FFB1, FFB2, ..., FFB25, the flip flop circuits FFC1, FFC2, ..., FFC25, and the flip flop circuits FFD1, FFD2, ..., FFD25 are connected to delay circuits 65, 67, 69 and to the input terminals B1, B2, B3, A1, A2, A3 of the selector circuit 63 in a similar manner as above. Outputs from output terminals Y0, Y1, Y2, and Y3 of the selector circuit 63 are inputted to the flip flop circuits FFA1, FFB1, FFC1, and FFD1 at the first stage of the adjacent driver IC via buffers 71, 73, 75, and 77. The shift register as described above can switch the number of the shifting stages to twenty four (24) stages or twenty five (25) stages by switching the signals outputted from the selector circuit 63 to the adjacent driver IC. The LED head 31 has 26 pieces of the driver IC's having the shift registers as described above, and accordingly, the entire LED head 31 makes up a shift register circuit having 24×26 stages or 25×26 stages.

The drive IC has an input circuit 79 generating a clock signal that is inputted to the flip flop circuit FFA1, FFA2, ..., FFA25, the flip flop circuit FFB1, FFB2, ..., FFB25, the flip flop circuit FFC1, FFC2, ..., FFC25, and the flip flop circuit FFD1, FFD2, ..., FFD25. The input circuit 79 converts the small amplitude differential signals HD-CLK-P, a HD-CLK-N inputted from the print control unit 3 into theoretical amplitudes used in the driver IC. The output result of the input circuit 79 is inputted to the flip flop circuit FFA1, FFA2, ..., FFA25, the flip flop circuit FFB1, FFB2, ..., FFB25, the flip flop circuit FFC1, FFC2, ..., FFC25, and the flip flop circuit FFD1, FFD2, ..., FFD25 via the buffer 81. At this moment, the clock signal inputted to the flip flop circuit FFA1, FFA2, ..., FFA25, the flip flop circuit FFB1, FFB2, ..., FFB25, the flip flop circuit FFC1, FFC2, ..., FFC25, and the flip flop circuit FFD1, FFD2, ..., FFD25 is delayed relative to the print data signals HD-DATA 3 to 0 due to the input circuit 79 and the buffer 81, but the influence caused by such signal delay is reduced by delay circuits 61, 65, 67, and 69 arranged on the path of the print data signals HD-DATA 3 to 0.

The driver IC has latch circuits LTA1, LTA2, ..., LTA24 latching the print data signal HD-DATA 0 stored in the flip flop circuits FFA1, FFA2, ..., FFA23, FFA25, latch circuits LTB1, LTB2, ..., LTB24 latching the print data signal HD-DATA 1 stored in the flip flop circuits FFB1, FFB2, ..., FFB23, FFB25, latch circuits LTC1, LTC2, ..., LTC24 latching the print data signal HD-DATA 2 stored in the flip flop circuits FFC1, FFC2, ..., FFC23, FFC25, and latch circuits LTD1, LTD2, ..., LTD24 latching the print data signal HD-DATA 3 stored in the flip flop circuits FFD1, FFD2, ..., FFD23, FFD25. The latch circuits LTA1, LTA2, ..., LTA24 are connected to the corresponding output terminals Q of the flip flop circuits FFA1, FFA2, ..., FFA23, FFA25, respectively, and latches the print data signal HD-DATA 0 based on the latch signal HD-LOAD inputted from the print control unit 3. Similarly, the latch circuits LTB1, LTB2, ..., LTB24, the latch circuits LTC1, LTC2, ..., LTC24, and the latch circuits LTD1, LTD2, ..., LTD24 latch the corresponding print data signals HD-DATA 3-1 stored in the flip flop circuits FFB1, FFB2, . . . , FFB23, FFB25, the flip flop circuits FFC1, FFC2, . . . , FFC23, FFC25, and the flip flop circuits FFD1, FFD2, . . . , FFD23, FFD25, respectively.

The driver IC has a memory cell circuit MEM 2 storing dot correction data for correcting the light amount of LED devices LED1, LED2, . . . , LED192. The LED head 31 has 96 pieces of the memory cell circuits MEM2 corresponding to each of the LED devices LED1, LED2, . . . , LED192. The LED head 31 corrects the light amount by adjusting driving currents supplied to the LED devices LED1, LED2, . . . , LED192 to 16 levels based on the light amount correction data stored in the memory cell circuit MEM2. Hereinafter, the structure of the memory cell circuit MEM2 will be specifically described in detail.

Figure 4:
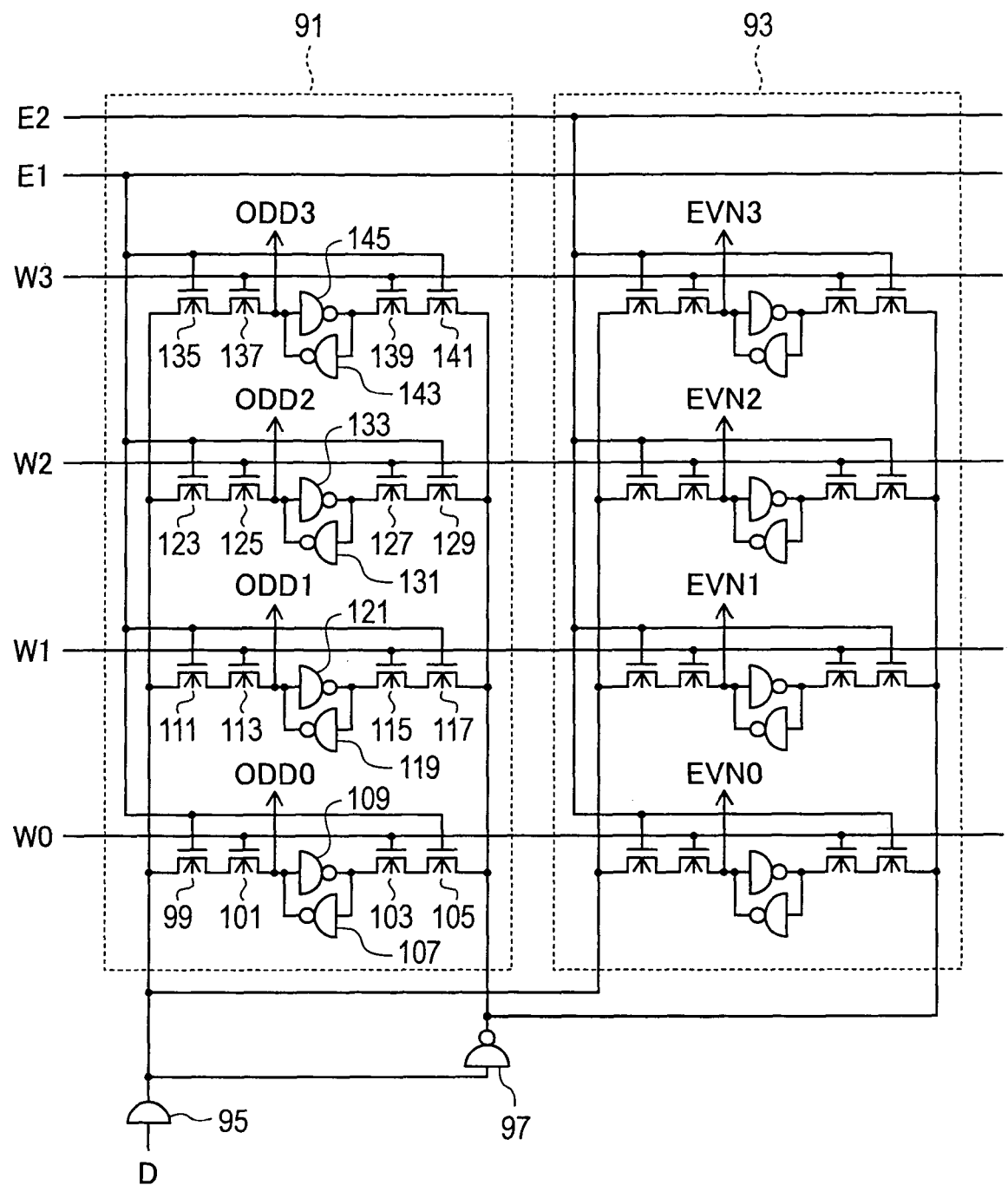
FIG. 4 is a circuit diagram of a memory cell circuit of the driver IC.

As shown in FIG. 4, the memory cell circuit MEM2 has a memory cell circuit 91 storing the correction data for even-numbered dots and a memory cell circuit 93 storing the correction data for odd-numbered dots. Each of the memory cell circuit 91 storing the correction data for the even-numbered dots and the memory cell circuit 93 storing the correction data for the adjacent odd-numbered dots is connected to the output terminal of a buffer circuit 95 and to an inverter 97 generating a data signal in complementary relation to the output signal of the buffer circuit 95. The input terminal D of the buffer circuit 95 is connected to the output terminal of the corresponding flip flop circuit. The memory cell circuit 91 is consisted of inverters 107, 109 constituting a correction memory cell connected between n-type MOS transistors 99, 101 and an n-type MOS transistors 103, 105, which are connected in series. The memory cell circuit 91 has four pieces of these n-type MOS transistors 99, 101, 103, 105 and the inverters 107, 109, such that each set corresponds to each correction data. In the memory cell circuit 91, the memory circuit consisting of the n-type MOS transistors 99, 101, 103, 105 and the inverters 107, 109 stores correction data ODD0. In the memory cell circuit 91, the memory circuit consisting of the n-type MOS transistors 111, 113, 115, 117 and the inverters 119, 121 stores correction data ODD1, the memory circuit consisting of the n-type MOS transistors 123, 125, 127, 129 and the inverters 131, 133 stores correction data ODD2, and the memory circuit consisting of the n-type MOS transistors 135, 137, 139, 141 and the inverters 143, 145 stores correction data ODD3.

In the memory circuit as described above, the gates of the n-type MOS transistors 101, 103, 113, 115, 125, 127, 137, 139 adjacently connected to the inverters 107, 109, the inverters 119,121, the inverters 131,133, and the inverters 143, 145 are connected to memory cell selection terminals W0, W1, W2, W3 of a cell selection circuit 151. An enable signal E1 outputted from the cell selection circuit 151 to authorize writing data of the odd-numbered dots is inputted to the gates of the other n-type MOS transistors 99, 105, 111, 117, 123, 129, 135, 141 that constitute the memory cell. In the memory cell circuit 91 as described above, the correction data is stored to the selected memory cell circuit, in a case where writing control signals W0 to W3 are inputted to the above-described memory cell circuit 91 from the memory cell selection terminals W0, W1, W2, W3 of the cell selection circuit 151 while the enable signal E1 is inputted to the gates of the n-type MOS transistors 99, 105, 111, 117, 123, 129, 135, 141. Then, the stored correction data is read out via the output terminals ODD0 to ODD3. The memory cell circuit 93 has the same structure as the memory cell circuit 91, and stores the correction data based on the writing control signals W0 to W3 and an enable signal E2 inputted from the cell selection circuit 151. The correction data stored in the memory cell circuit 93 is read out via output terminals EVN0 to ENV3.

Figure 5:
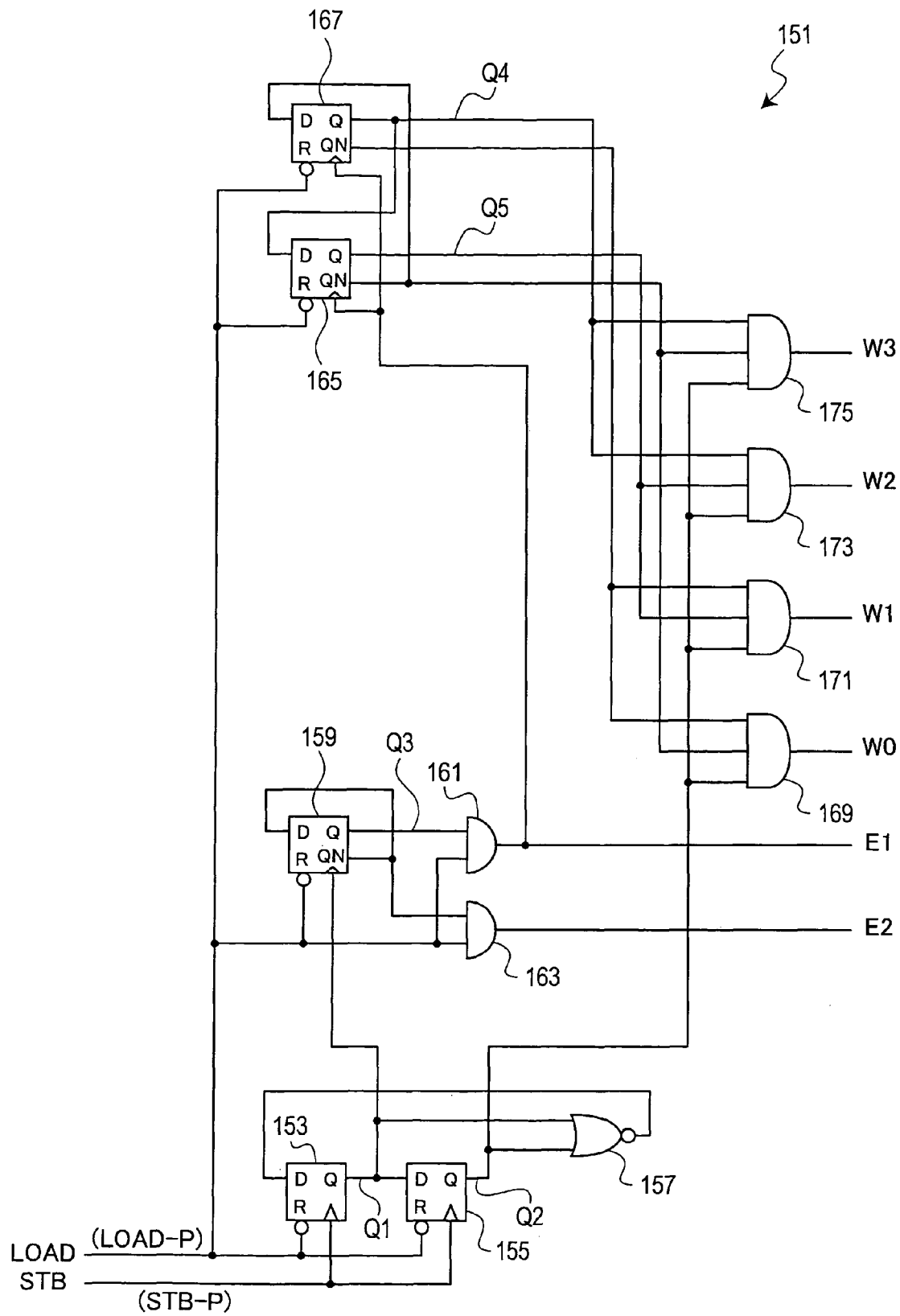
FIG. 5 is a circuit diagram of a cell selection circuit of the driver IC.

As shown in FIG. 5, the cell selection circuit 151 has flip flop circuits 153, 155 into which a latch signal LOAD-P and a strobe signal STB-P are inputted. The strobe signal STB-P is inputted to clock terminals of the flip flop circuits 153, 155. Output terminals Q of the flip flop circuits 153, 155 are connected to an NOR circuit 157. Each of an output signal Q1 outputted from the output terminal Q of the flip flop circuit 153 and an output signal Q2 outputted from the output terminal Q of the flip flop circuit 155 is inputted to the NOR circuit 157. The output terminal of the NOR circuit 157 is connected to the input terminal D of the flip flop circuit 153. The output terminal Q of the flip flop circuit 153 is connected to the input terminal of the flip flop circuit 155 and to the clock terminal of the flip flop circuit 159. The output terminal Q of the flip flop circuit 159 is connected to one of the input terminals of an AND circuit 161. An output signal Q3 outputted from the output terminal Q of the flip flop circuit 159 is inputted to the one of the input terminals of the AND circuit 161. An output terminal QN of the flip flop circuit 159 is connected to an input terminal D of itself and one of the input terminals of an AND circuit 163. The latch signal LOAD-P is inputted to the flip flop circuit 159 and the AND circuits 161, 163. Based on the inputted latch signal LOAD-P, the AND circuits 161, 163 output logical multiplications as the enable signals E1, E2. The enable signal E1 outputted from the AND circuit 161 is inputted to the clock terminals of the flip flop circuits 165, 167. An output terminal QN of a flip flop circuit 165 is connected to an input terminal D of a flip flop circuit 167. An output terminal Q of the flip flop circuit 167 is connected to an input terminal D of the flip flop circuit 165. Every time the enable signal E1 is inputted to the flip flop circuits 165, 167, the flip flop circuits 165, 167 transits their states and output the output signals Q4, Q5 and the like from the output terminals Q, QN. The output signals Q4, Q5 and the like are inputted to the AND circuits 169, 171, 173, 175, which output the writing control signals W0 to W3.

The input terminals of the AND circuits 169,171,173,175 are connected to the output terminal Q of the flip flop circuit 155. Each of the input terminals of the AND circuits 169,171, 173,175 are connected to either of the output terminals Q, QN of the flip flop circuits 165, 167. Specifically, the AND circuit 169 outputting the writing control signal W0 is connected to the output terminal QN of the flip flop circuit 165 and to the output terminal QN of the flip flop circuit 167. The AND circuit 169 outputs the logical multiplication of the output signal outputted from the output terminal QN of the flip flop circuit 165, the output signal outputted from the output terminal QN of the flip flop circuit 165, and the output signal Q outputted from the output terminal Q of the flip flop circuit 155. The logical multiplication outputted from the AND circuit 169 is the writing control signal W0, and is inputted to all of the memory cell circuits MEM2. The AND circuit 171 outputting the writing control signal W1 is connected to the output terminal Q of the flip flop circuit 165 and the output terminal QN of the flip flop circuit 167. The AND circuit 171 outputs the logical multiplication of the output signal outputted from the output terminal Q of the flip flop circuit 165, the output signal outputted from the output terminal QN of the flip flop circuit 167, and the output signal Q outputted from the output terminal Q of the flip flop circuit 155. The logical multiplication outputted from the AND circuit 171 is the writing control signal W1, and is inputted to all of the memory cell circuits MEM2. The AND circuit 173 outputting the writing control signal W2 is connected to the output terminal Q of the flip flop circuit 165 and the output terminal Q of the flip flop circuit 167. The AND circuit 173 outputs the logical multiplication of the output signal outputted from the output terminal Q of the flip flop circuit 165, the output signal outputted from the output terminal Q of the flip flop circuit 167, and the output signal Q outputted from the output terminal Q of the flip flop circuit 155. The logical multiplication outputted from the AND circuit 173 is the writing control signal W2, and is inputted to all of the memory cell circuits MEM2. The AND circuit 175 outputting the writing control signal W3 is connected to the output terminal QN of the flip flop circuit 165 and the output terminal Q of the flip flop circuit 167. The AND circuit 175 outputs the logical multiplication of the output signal outputted from the output terminal QN of the flip flop circuit 165, the output signal outputted from the output terminal Q of the flip flop circuit 167, and the output signal Q outputted from the output terminal Q of the flip flop circuit 155. The logical multiplication outputted from the AND circuit 175 is the writing control signal W3, and is inputted to all of the memory cell circuits MEM2.

The writing control signals W0 to W3 and the enable signal E1 outputted from the cell selection circuit 151 as described above are inputted to a memory circuit 181 arranged together with the memory cell circuit MEM2. An input terminal D of the memory circuit 181 is connected to the output terminal Q of the flip flop circuit FFD25 arranged at the last stage of the shift register. The memory circuit 181 stores inputted data according to the writing control signals W0 to W3 and the enable signal E1 outputted from the cell selection circuit 151. The data stored to the memory circuit 181 is read out by a control voltage generation circuit 183.

The enable signal E1 and the writing control signal W3 outputted from the cell selection circuit 151 are connected to the input terminal of an AND circuit 185. The output terminal of the AND circuit 185 is connected to an input terminal G of a latch device 187, serving as a switch control unit, outputting a signal used for switching a control voltage of the LED devices LED1, LED2, . . . , LED192.

Figure 6:
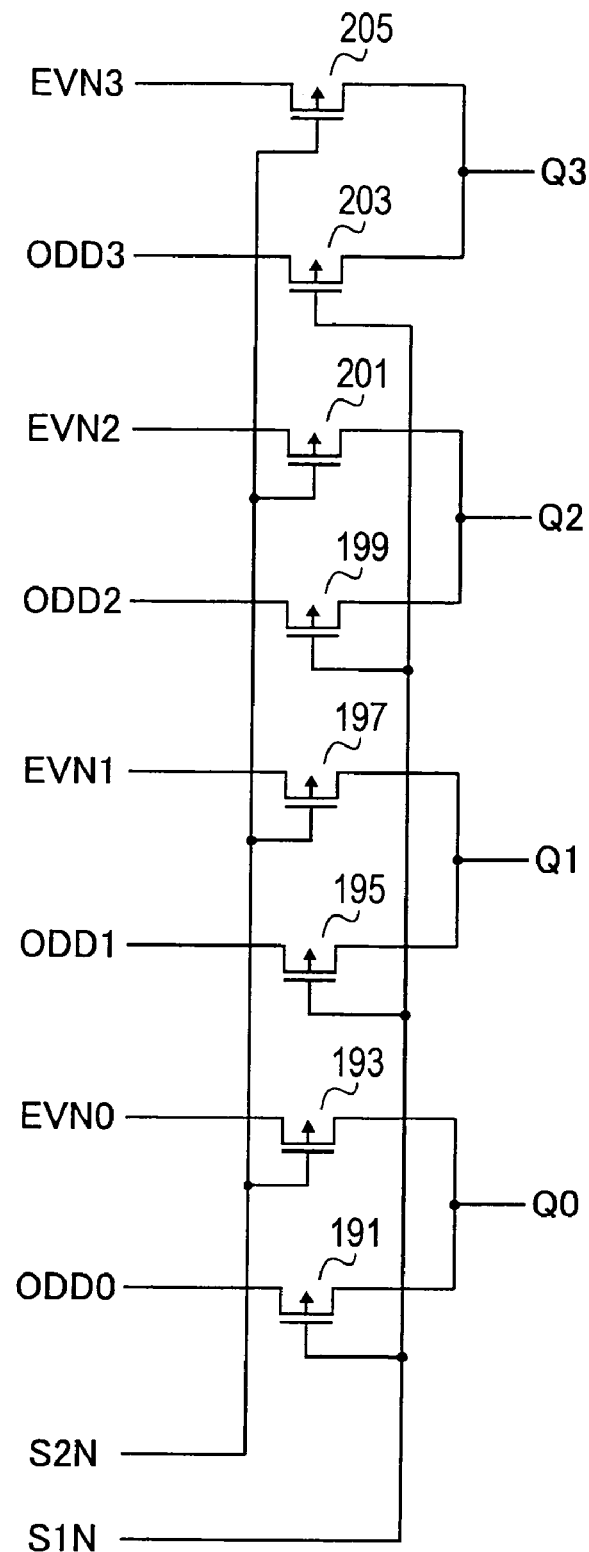
FIG. 6 is a circuit diagram of a multiplexer circuit of the driver IC.

The driver IC has multiplexer circuits MUX2 for reading out the correction data stored in the memory cell circuit MEM2 and inputting the correction data to a driving circuit DRV. The multiplexer circuits MUX2 as described above is arranged to correspond to each of the LED devices LED1, LED2, . . . , LED192. Each of selection control signals S1N, S1P, S2N, S2P outputted from a control circuit CTRL2 is inputted to the multiplexer circuit MUX2. As shown in FIG. 6, p-type MOS transistors 191, 193, . . . , 205 are arranged in the multiplexer circuits MUX2. The selection control signal S1N is inputted from the control circuit CTRL2 to each of the gates of the p-type MOS transistors 191, 195, 199, 203 receiving the input of the odd-numbered correction data ODD0, ODD1, ODD2, ODD3. The selection control signal S2N is inputted from the control circuit CTRL2 to each of the gates of the p-type MOS transistors 193, 197, 201, 205 receiving the input of the even-numbered correction data EVN0, EVN1, EVN2, EVN3. When the selection control signals S1N, S2N are alternately inputted to the multiplexer circuits MUX2, the multiplexer circuit MUX2 outputs the correction data to the driving circuit DRV via the output terminals Q0, Q1, Q2, Q3 according to the correction data ODD0, ODD1, ODD2, ODD3 and the correction data EVN0, EVN1, EVN2, EVN3. It should be noted that the operation and the effect of the multiplexer circuits MUX2 will be later described in detail together with the reference voltage generation circuit.

Figure 7:
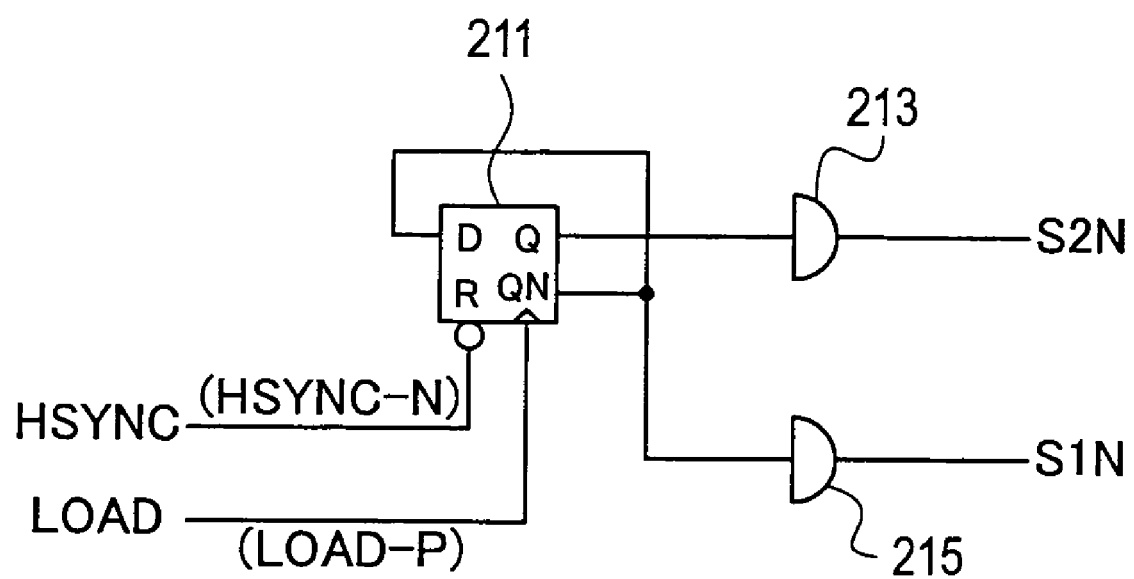
FIG. 7 is a circuit diagram of a control circuit of the driver IC.

As shown in FIG. 7, the control circuit CTRL2 has a flip flop circuit 211 into which the latch signal LOAD-P and a main scanning synchronization signal HYSYNC are inputted. An input terminal D of the flip flop circuit 211 is connected to an output terminal QN of itself. An output terminal Q of the flip flop circuit 211 is connected to a buffer circuit 213. The output circuit QN of the flip flop circuit 211 is connected to the buffer circuit 215. The flip flop circuit 211 as described above and buffer circuits 213, 215 output the selection control signals S1N, S2N based on the main scanning synchronization signal HYSYNC and the latch signal LOAD-P inputted.

Figure 8:
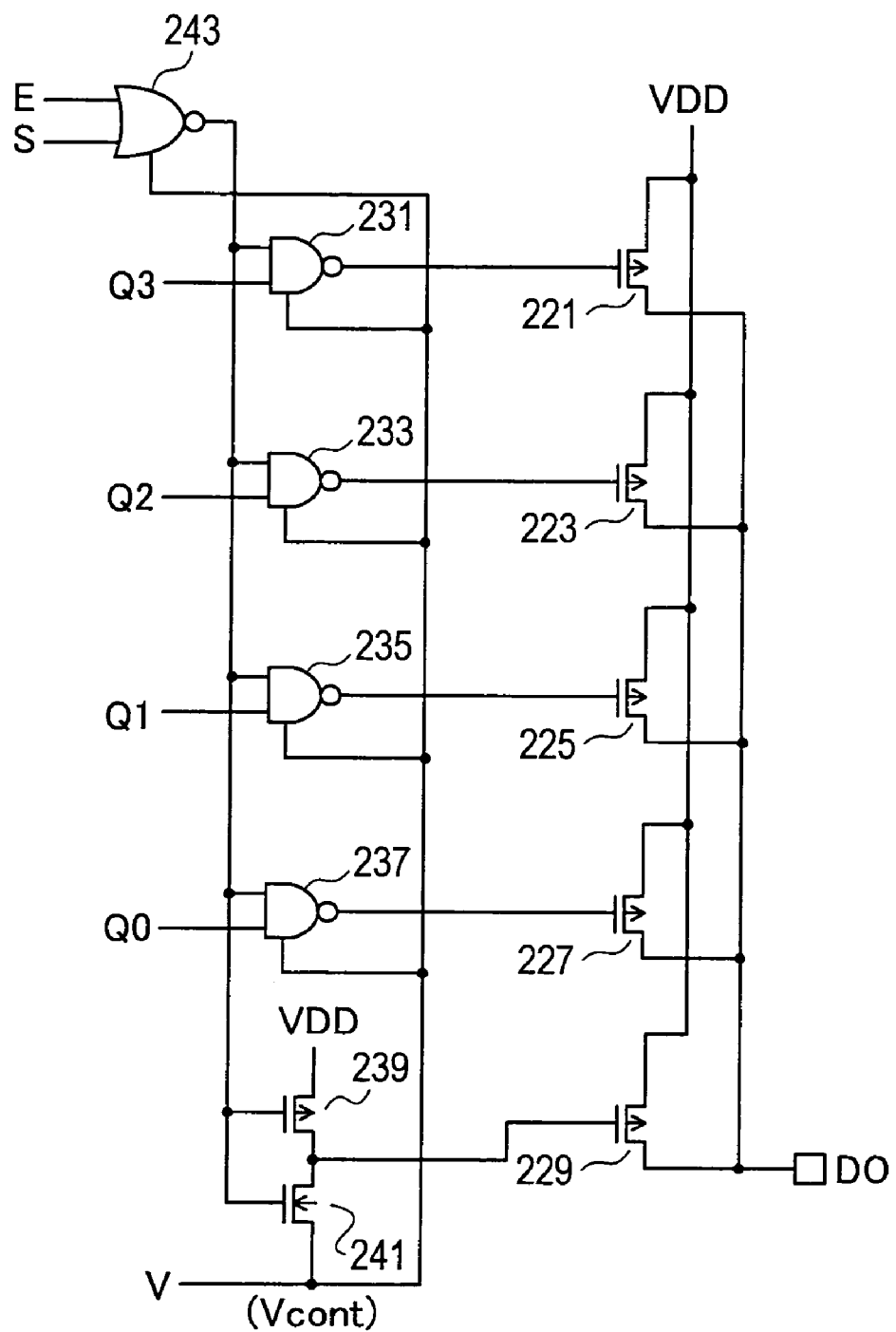
FIG. 8 is a circuit diagram of a driving circuit of the driver IC.

The driver IC has the driving circuit DRV for driving the LED devices LED1, LED2, . . . , LED192. The driving circuits DRV are arranged to correspond to each of the LED devices LED1, LED2, . . . , LED192, and operate based on the correction data outputted via the multiplexer circuits MUX2, the strobe signal STB-P, and the control voltage Vcont supplied by the control voltage generation circuit 183. As shown in FIG. 8, the driving circuits DRV as described above have p-type MOS transistors 221, 223, 225, 227, 229, each of which has its source terminal connected to a power supply Vdd. The drain terminals of the p-type MOS transistors 221, 223, 225, 227, 229 are connected to an output terminal DO. Among the five p-type MOS transistors 221, 223, 225, 227, 229, the gates of the four p-type MOS transistors 221, 223, 225, 227 are connected to the output terminals of NAND circuits 231, 233, 235, 237, respectively. The correction data ODD3, ODD2, ODD1, ODD0 or the correction data EVN3, EVN2, EVN1, EVN0 supplied from the multiplexer circuits MUX2 is inputted to the NAND circuits 231, 233, 235, 237. These p-type MOS transistors 221, 223, 225, 227 work as auxiliary driving transistors for adjusting driving currents supplied to the LED devices LED1, LED2, . . . , LED192 to adjust the light amount of the LED devices LED1, LED2, . . . , LED192. On the other hand, a p-type MOS transistor 229 is connected to a p-type MOS transistor 239 and an n-type MOS transistor 241 constituting an inverter. The source terminal of the p-type MOS transistor 239 constituting the inverter is connected to the power supply Vdd, and the source terminal of the n-type MOS transistor 241 constituting the inverter is supplied with the control voltage Vcont. An output voltage of the inverter consisting of the p-type MOS transistor 239 and the n-type MOS transistor 241 is supplied to the gate of the p-type MOS transistor 229. The p-type MOS transistor 229 functions as a main driving transistor supplying the main driving current to the LED devices LED1, LED2, . . . , LED192.

The other input terminals of the NAND circuits 231, 233, 235, 237 are connected to an NOR circuit 243. The NOR circuit 243 is connected to an input terminal E into which the print data signal is inputted from the latch circuit, and is also connected to an input terminal S into which the strobe signal STB-P is inputted. The strobe signal STB-P as described above is inputted to a strobe signal input terminal STB in FIG. 3, and is inputted to an NAND circuit 249 via a pull-up element 245 and an inverter circuit 247. In addition to the strobe signal STB-P, the latch signal LOAD-P is inputted to the NAND circuit 249 via the inverter circuit 251. The output terminal of the NAND circuit 249 is connected to the input terminals S of the driving circuits DRV, and a calculation result of the NAND circuit 249 is inputted to the NOR circuit 243 via the input terminal S. The driving circuits DRV control turning on and off the LED devices LED1, LED2, . . . , LED192 based on the inputted strobe signal STB-P.

The calculation result of the NOR circuit 243 is inputted to each of the NAND circuits 231, 233, 235, 237. The power supply of the NAND circuits 231, 233, 235, 237 and the NOR circuit 243 is connected to the power suppy Vdd. The ground of the NAND circuits 231, 233, 235, 237 and the NOR circuit 239 is connected to a terminal V into which the control voltage Vcont is inputted.

The driving circuits DRV as described above use the drain current of the p-type MOS transistor 229 as the main current, and drives the LED devices LED1, LED2, ..., LED192 with the driving current of the summation of the main current and the drain current of the selected auxiliary driving transistor, thus controlling the light amount thereof. Specifically, while any one of the p-type transistors 221, 223, 225, 227 is driving, the driving circuit DRV causes the output of the NAND circuits 231, 233, 235, 237 to be a low level signal, which is substantially the same level as the control voltage Vcont. Thus, the gate potential of the p-type MOS transistors 221, 223, 225, 227 becomes substantially the same as the control voltage Vcont. At this moment, the p-type MOS transistor 239 becomes turned off, and the n-type MOS transistor 241 becomes turned on, and accordingly, the gate potential of the p-type MOS transistor 229 becomes substantially the same as the control voltage Vcont. That is, the driving circuits DRV can collectively control the drain current of the p-type MOS transistors 221, 223, 225, 227, 229 with the control voltage Vcont. At this moment, the power supply of the NAND circuits 231, 233, 235, 237 is the power supply Vdd and operates using the control voltage Vcont as the ground. Accordingly, the potential of the signal inputted to the NAND circuits 231, 233, 235, 237 has only to be an potential appropriate for the potential of the power supply Vdd and the potential of the control voltage Vcont, and the inputted low level signal does not necessarily be 0V.

Figure 9:
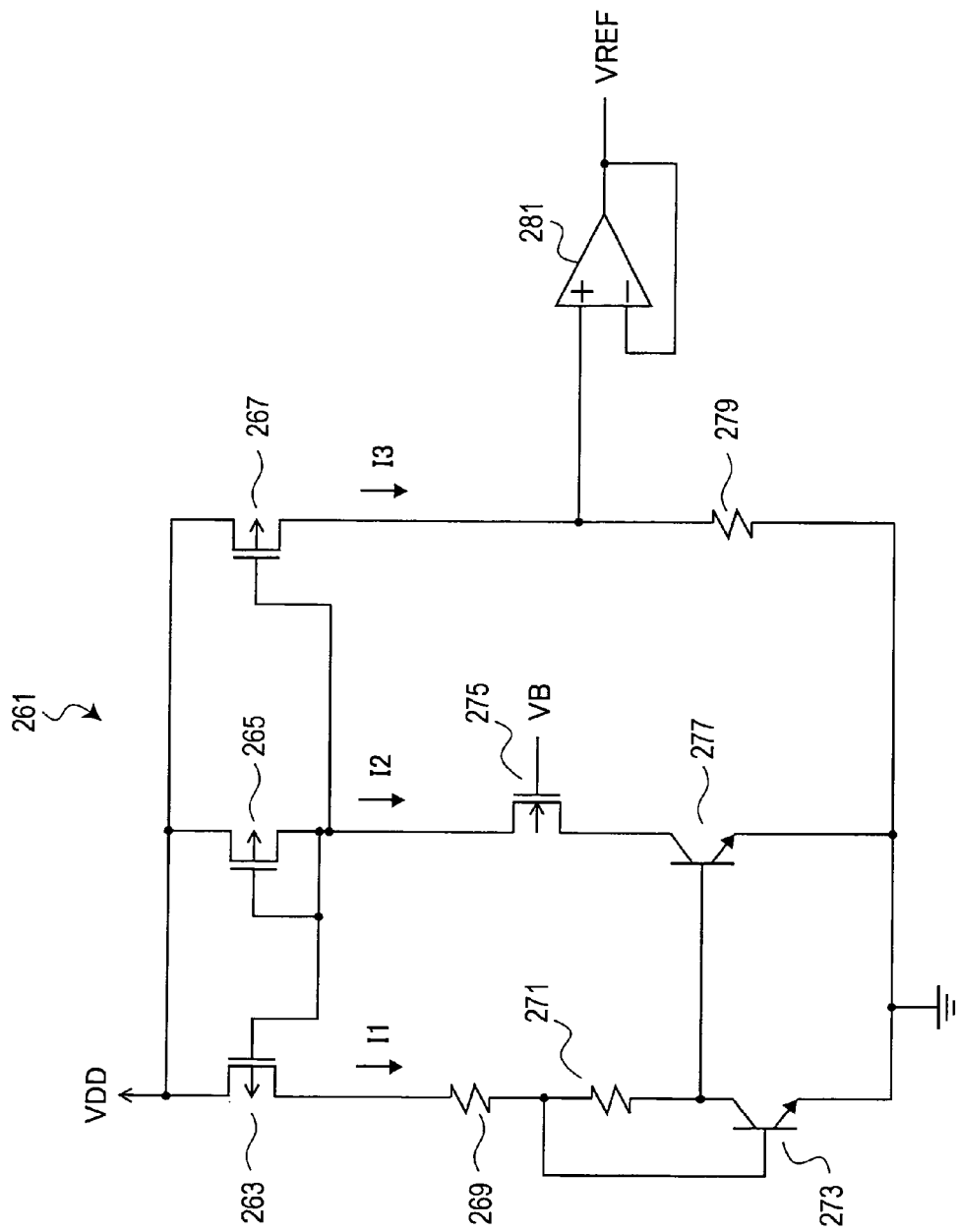
FIG. 9 is a circuit diagram of a reference voltage generation circuit of the driver IC.

The driver IC has a reference voltage generation circuit 261 functioning as a temperature compensation circuit. One set of the reference voltage generation circuit 261 is formed to each driver IC. A reference voltage VREF generated by the reference voltage generation circuit 261 is inputted to the control voltage generation circuit 183. The reference voltage generation circuit 261 as described above generates a reference voltage based on the temperature of the LED device. Specifically, as shown in FIG. 9, the reference voltage generation circuit 261 has the p-type MOS transistors 263, 265, 267 whose source terminals are connected to the power supply Vdd. The gates of the p-type MOS transistors 263, 265, 267 are collectively connected to the drain terminal of the p-type MOS transistor 265. The drain terminal of the p-type MOS transistor 263 is connected to an end of a resistor 269. The other end of the resistor 269 is connected to an end of a resistor 271 and to the base of the npn transistor 273. The other end of the resistor 271 is connected to the collector terminal of the npn transistor 273, and the emitter terminal of the npn transistor 273 is connected to the ground. A current I1 flows in the p-type MOS transistor 263, the resistor 269, the resistor 271, and the npn transistor 273 as structured above. The drain terminal of the p-type MOS transistor 265 is connected to the drain terminal of an n-type MOS transistor 275. The gate of the n-type MOS transistor 275 is connected to a bias circuit, not shown, and a voltage VB is applied thereto. The source terminal of the n-type MOS transistor is connected to the collector terminal of an npn transistor 277. The base of the npn transistor 277 is connected to the collector terminal of the npn transistor 273. The emitter terminal of the npn transistor 277 is connected to the ground. A current I2 flows in the p-type MOS transistor 265, the n-type MOS transistor 275, and the npn transistor 277 as structured above.

At this moment, a device area ratio between the npn transistor 273 and the npn transistor 277 is preferably configured to be 1: K (K>1). At this moment, the value K is preferably an integer. In place of the npn transistor 277, K pieces of pnp transistors in the same shape as the npn transistor 273 may be connected in parallel.

The drain terminal of the p-type MOS transistor 267 is connected to an end of the resister 279 and a non-inverted input terminal of a operational amplifer 281. The other end of the register 279 is connected to the ground. A current I3 flows from the drain terminal of the p-type MOS transistor 267. An output terminal of the operational amplifer 281 is connected to an inversion input terminal of itself to form a voltage follower circuit. The output terminal of the operational amplifer 281 outputs a reference voltage VREF.

These p-type MOS transistors 263, 265, 267 are made to have the same gate length and the same gate width, so that these transistors produces the same drain currents. The p-type MOS transistors 263, 265, 267 are connected to make the voltage between the gate and the source be the same, thus maintaining current mirror relationship. As a result, the above-described currents I1, I2, I3 become substantially the same.

In the reference voltage generation circuit 261 as described above, the base current of the npn transistor 273 is so small that it can be disregarded. Accordingly, the emitter current Ie of the npn transistor 273 is calculated as follows.

$$Ie \approx Io \times \exp(q \times Vbe_{273}/(kT)) \quad \text{(Formula 1)}$$

Io denotes a saturation current (A). $Vbe_{273}$ denotes the base-emitter voltage of the npn transistor 273. k denotes the Boltzmann constant ($k=1.38 \times 10_{-23}$[J/K]). q denotes the potential of the electron ($q=1.6 \times 10_{-19}$[C]). T denotes an absolute temperature [K]. Below Formula 2 is obtained upon transforming Formula 1.

$$Vbe_{273} = (kT/q) \times \ln(Ie/Io) \quad \text{(Formula 2)}$$

As described above, the npn transistor 277 has the area K times larger than the area of the npn transistor 273. The base-emitter voltage $Vbe_{277}$ of the npn transistor 277 is as follows.

$$Vbe_{277} = (kT/q) \times \ln(Ie/(K \times Io)) \quad \text{(Formula 3)}$$

At this moment, the voltage between both of the terminals of the resistor 271 becomes equal to the difference of the base-emitter voltages between the npn transistor 273 and the npn transistor 277. Let $\Delta Vbe$ stand for the difference therebetween, and below Formula 4 and Formula 5 are obtained.

$$\Delta Vbe = (kT/q) \times \ln(Ie/Io) - (kT/q) \times \ln(Ie/(K \times Io)) \quad \text{(Formula 4)}$$

$$\Delta Vbe = (kT/q) \ln(K) \quad \text{(Formula 5)}$$

At this moment, the base current of the npn transistor 273 is so small that it can be disregarded. Accordingly, the emitter current value and the collector current value of the npn transistor 273 are substantially the same, and the current I1 becomes as follows.

$$I1 = \Delta Vbe/R1 \quad \text{(Formula 6)}$$

$$I1 = kT/(q \times R1) \times \ln(K) \quad \text{(Formula 7)}$$

As described above, the current I1 and the current I3 are substantially the same. In a case where it is assumed that the resistance value of the resister 271 is R1 and the resistance value of the register 279 is R2, a terminal potential Vref0 of the register 279 becomes as follows.

$$Vref0 = kT/q \times (R2/R1) \times \ln(K) \quad \text{(Formula 8)}$$

The resister 271 and the resister 279 are formed of the same material, so that the resistance ratio (R2/R1) does not depend on the temperature. Accordingly, it can be understood that there is a temperature characteristic that a terminal potential Vref0 of the resister 279 increases in proportion to the absolute temperature T. The terminal potential Vref0 is inputted to the non-inverted input terminal of the operational amplifier 281, and an output voltage substantially the same as the terminal potential Vref0 is outputted as the reference voltage VREF from the voltage follower circuit. The reference voltage generation circuit as described above can increase the output voltage in proportion to the increase of the temperature, and thus, can compensate the decrease of the light-emitting power caused by the increase of the temperature of the LED device.

The reference voltage VREF outputted from the reference voltage generation circuit 261 as described above is inputted to an analog switch device 291 controlled based on an output value of the output terminal Q of the latch device 187. The output value of the output terminal Q of the latch device 187 serves as a control signal. The analog switch device 291 selectively allows conduction between the reference voltage generation circuit 261 and the control voltage generation circuit 183 and conduction between the reference voltage generation circuit 261 and control voltage generation circuits of other driver IC's. When the output terminal Q of the latch device 187 inputs a high level signal as an OE (Output Enable) signal into the analog switch device 291, the analog switch device 291 becomes conductive between the first terminal and the second terminal, and thereby, the reference voltage VREF outputted from the reference voltage generation circuit 261 is inputted to the control voltage generation circuit 183, and is also inputted to other driver IC's via the reference voltage terminal VREF.

Figure 10:
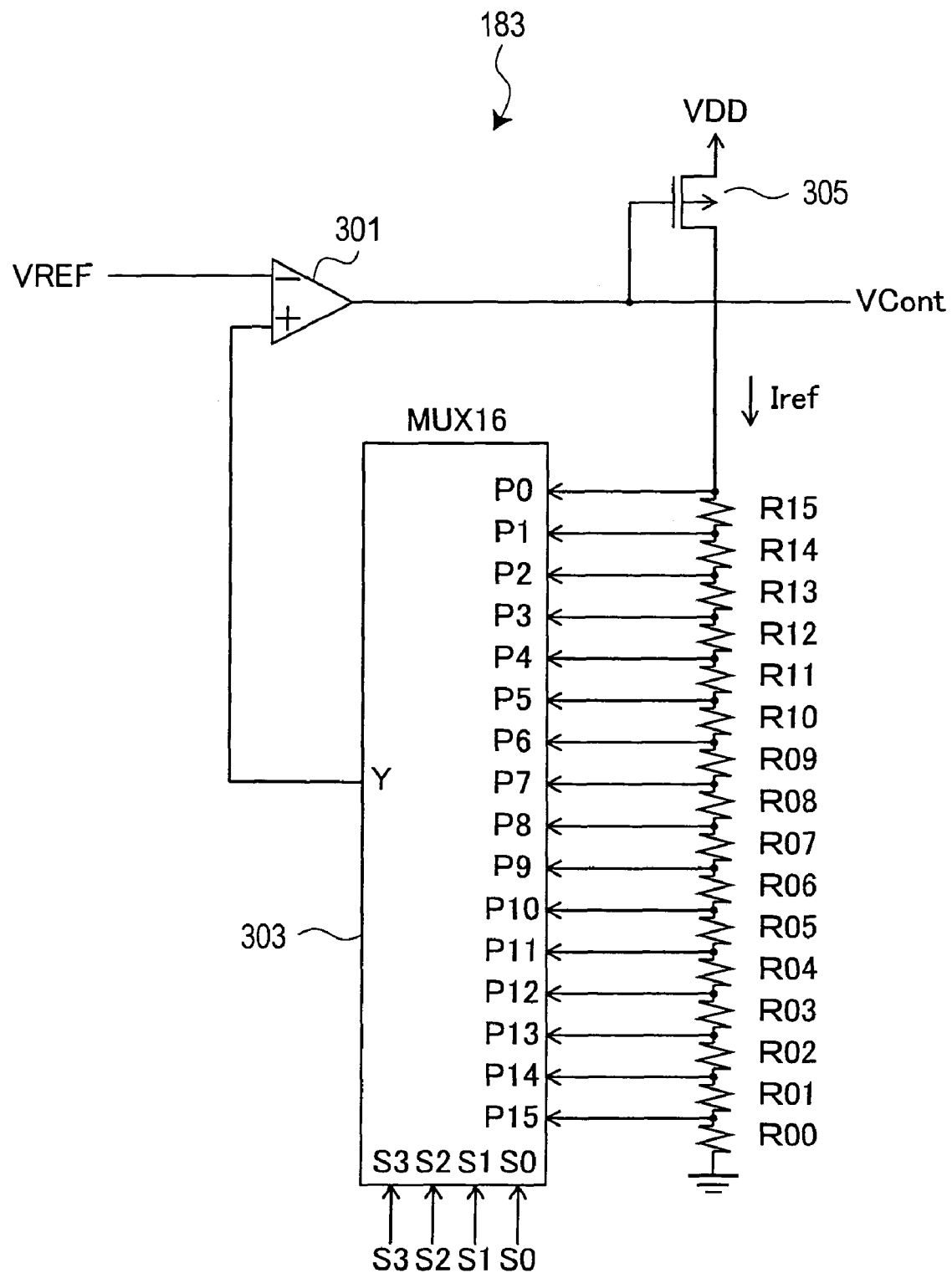
FIG. 10 is a circuit diagram of a control voltage generation circuit of the driver IC.

As shown in FIG. 10, the control voltage generation circuit 183 has a operational amplifier 301 into which the reference voltage VREF is inputted from the reference voltage generation circuit 261. Specifically, the reference voltage VREF is inputted to the inverted input terminal of the operational amplifer 301. The non-inverted input terminal of the operational amplifer 301 is connected to an output terminal Y of a multiplexer circuit 303.

Chip correction data stored in the memory circuit 181 is inputted to the multiplexer circuit 303. The multiplexer circuit 303 as described above has 16 input terminals P0, P1, ..., P15 into which analog voltages are inputted, and also has input terminals S3 to S0 into which data stored in the memory circuit 181 is inputted. In addition, the control voltage generation circuit 183 has the resisters R01, R02, ..., R15 arranged in series. One end of a register R15 is connected to the power supply Vdd via a p-type MOS transistor 305. The gate of the p-type MOS transistor 305 is connected to the output terminal of the operational amplifer 301. The input terminals P15, P14, ..., P0 of the multiplexer circuit 303 are respectively connected to intermediate connection points between the resisters R01, R02, ..., R15 making a resister series. The multiplexer circuit 303 selects either of the input terminals P15, P14, ..., P0 based on four logical signals inputted via input terminals S3 to S0, and allows conduction between the selected input terminal and the output terminal Y.

The multiplexer circuit 303 as described above has a feedback circuit consisting of the operational amplifier 301, the resisters R01, R01, ..., R15 constituting the resister series, and the p-type MOS transistor 305. The potential of the non-inverted input terminal of the operational amplifier 301 is controlled to be substantially the same as the reference voltage VREF. The drain current of the p-type MOS transistor 305 is determined based on a combined resistance value between the ground and the input terminals P15, P14, ..., P0 selected by the multiplexer circuit 331 and based on the reference voltage VREF inputted to the operational amplifer 301. As a result, the drain current of the p-type MOS transistor 305 can be changed to 16 levels in response to the input signals S3 to S0.

The output of the operational amplifer 301 is supplied to the gate of the p-type MOS transistor 305, and is also supplied as the control voltage Vcont to the driving circuits DRV.

In the below description, reference is made to FIG. 6 again. The relationship between the control voltage Vcont inputted to the driving circuit DRV as described above and the configuration of the multiplexer circuit MUX2 will be hereinafter described in detail.

According to the configuration of the multiplexer circuit MUX2 as described above, the multiplexer circuit is made with only the p-type MOS transistors. The use of the multiplexer circuit MUX2 as described above prevents problems that may occur during operation, and can decrease the number of used pixels.

Specifically, the selection control signal S1N is made to be the low level signal in order to turn on the p-type MOS transistor 191 corresponding to the correction data ODD0. In a case where the signal inputted as the correction data ODD0 is made to be the high level signal, the output terminal Q0 outputs a voltage substantially the same as the voltage level inputted as the correction data ODD0 to the p-type MOS transistor. On the other hand, the low level signal of approximately 0V is inputted as the correction data ODD0 to the p-type MOS transistor 191, the potential of the second terminal of the p-type MOS transistor drops to the voltage close to a threshold voltage of the p-type transistor, but does not drop to approximately 0V. Thus, there exists a defect in the transmission function of the low level signal in the multiplexer circuit as shown in FIG. 6. To prevent this defect of the transmission function as described above, a conventional art prepares a analog switch made of a p-type MOS transistor and an n-type MOS transistor connected with each other, and uses the analog switch as a switch means for selecting data. An output potential substantially the same as an input potential can be obtained through such multiplexer circuit configured as described above. However, in the case where the analog switch as described above is configured, the analog switch is needed that has a pair of the p-type MOS transistor and the n-type MOS transistor per one data signal of the correction data, thus resulting in problems that the number of used pixels increases and that the manufacturing cost increases due to the increased area occupied by the circuit.

On the other hand, in the case where the multiplexer circuit MUX2 in FIG. 6 is used, the multiplexer circuit MUX2 can be configured with only the p-type MOS transistors. Specifically, as described above, the multiplexer circuit MUX2 in FIG. 6 requires the high level signal having the input voltage substantially the same as the Vdd potential. Regarding the low level signal, the voltage value thereof is only to be lowered to the control voltage Vcont, and the potential of the low level signal is not needed to be lowered to approximately 0V. The configuration of the driving circuit as described above does not cause problems in the operation of the driving circuit DRV and allows miniaturization of the multiplexer circuit MUX2, even where the multiplexer circuit MUX2 is configured with only the p-type MOS transistors and where the circuit configuration is used that cannot lower the potential of the low level signal to approximately 0V.

The configuration of the LED head 31 having the driver IC as described above will be hereinafter described in detail.

Figure 11:
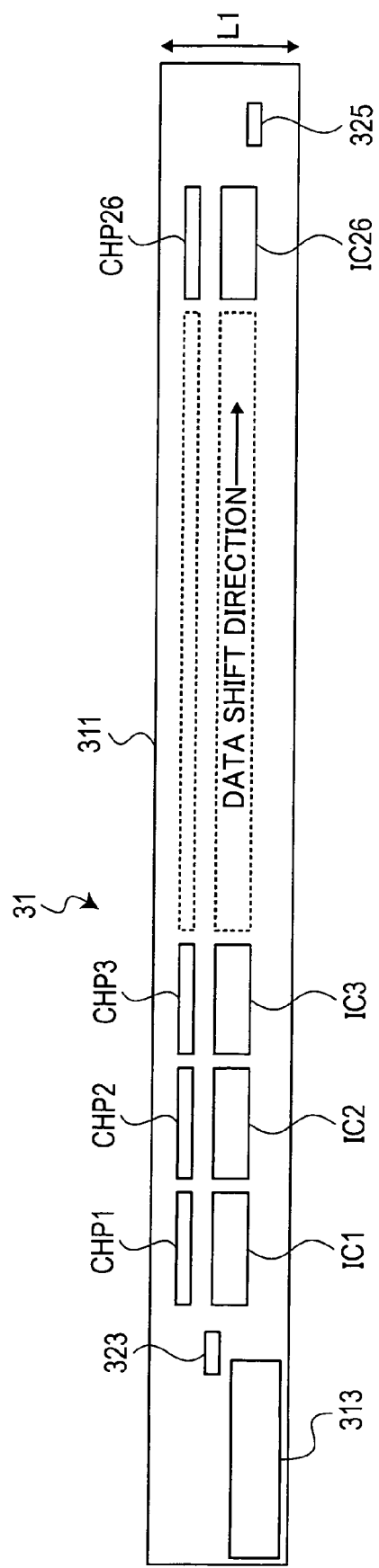
FIG. 11 is a plan view of the LED head.
Figure 12:
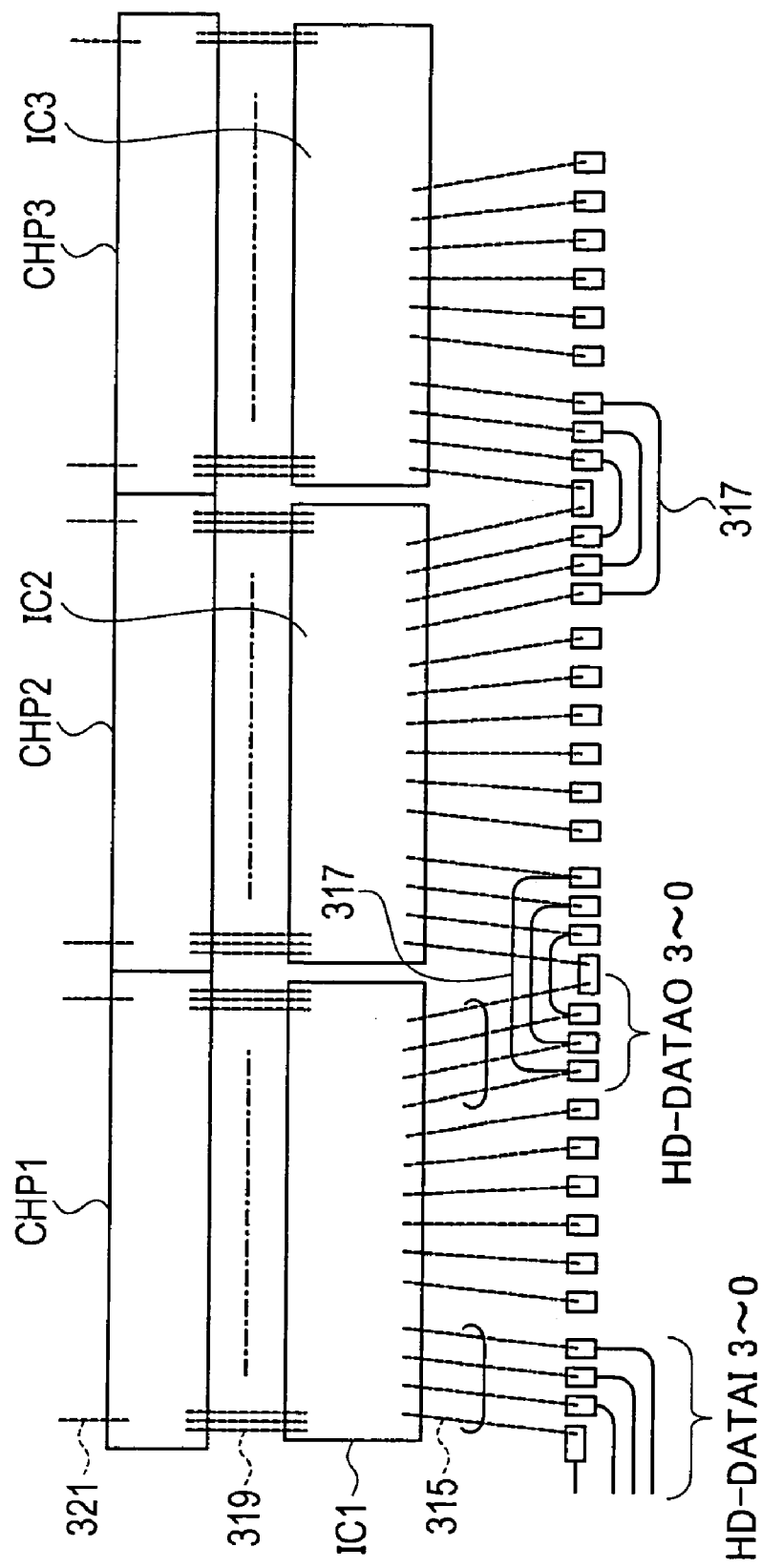
FIG. 12 is an enlarged plan view of an essential portion of the LED head.
Figure 13:
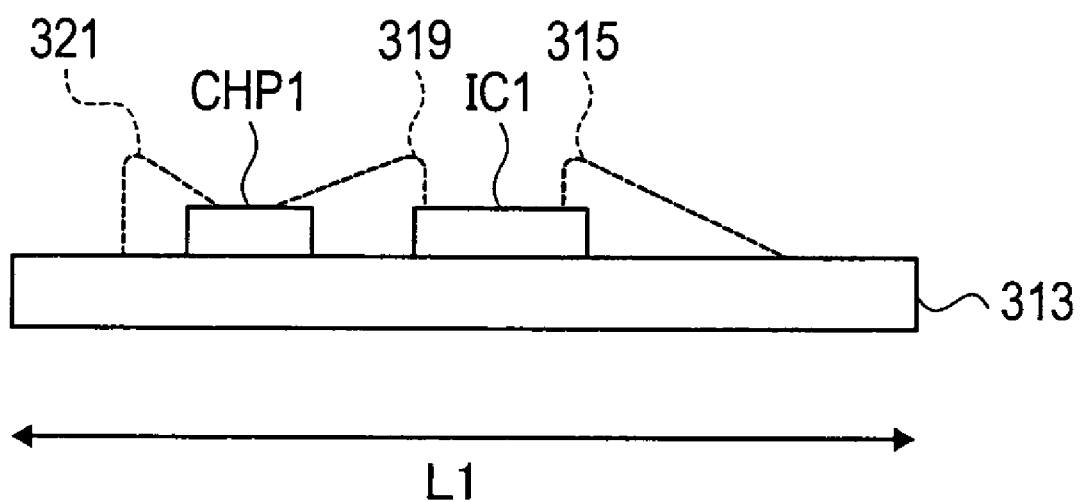
FIG. 13 is an elevation view of the LED head.

As shown in FIG. 11, the LED head 31 has 26 pieces of drivers IC1, IC2, ..., IC26 arranged along a longitudinal direction of a predetermined print circuit board 311 and 26 pieces of LED arrays CHP1, CHP2, ..., CHP26 arranged along the longitudinal direction of the print circuit board 311. It is assumed in the below description that the driver IC and the LED array are arranged in such a manner that the reference numeral assigned to the driver IC and the LED array becomes larger from the upstream side to the downstream side in the data shift direction. The LED head 31 has a connector unit 313 containing terminals for the above-described various control signals and power supply terminals. In parallel with the arranged drivers IC1, IC2, ..., IC26, the print circuit board 311 has print data signal terminals HD-DATAI3 to 0 for inputting the print data to the driver IC, a latch signal input terminal, a clock signal input terminal, a strobe signal input terminal, a synchronization signal input terminal, print data output terminals HD-DATAO3 to 0 for outputting the print data signal to the adjacent driver IC, and the like, as shown in FIGS. 12 and 13. Each terminal is connected to the drivers IC1, IC2, ..., IC26 via a bonding wire 315. The print data output terminals HD-DATAO3 to 0 formed downstream in the data shift direction of each of the drivers IC1, IC2, ..., IC26 are connected to the input terminals HD-DATAI3 to 0 of the adjacent driver IC via printed wirings 317.

The output terminal DO of the driving circuit DRV of each of the drivers IC1, IC2, ..., IC26 is connected via a bonding wire 319 to the anode terminal of corresponding one of the LED devices LED1, LED2, ..., LED192 constituting the LED arrays CHP1, CHP2, ... CHP26. The cathodes of the LED devices LED1, LED2, ..., LED192 are connected via bonding wires 321 to a cathode pad, not shown, arranged on the print circuit board 311.

The LED head 31 has a decoupling capacitors 323 arranged in proximity to the driver IC1 formed at the most upstream side in the data shift direction of the drivers IC1, IC2, ..., IC26 arranged in a line form, and also has a decoupling capacitors 325 arranged in proximity to the driver IC26 formed at the most downstream side in the data shift direction. Specifically, the decoupling capacitors 323, 325 are arranged in line with the drivers IC1, IC2, ..., IC26. Each of the decoupling capacitors 323, 325 serves as a noise voltage suppressing unit.

The decoupling capacitor 323 as described above is connected between the power supply Vdd of the driver IC1 and the ground. Similarly, the decoupling capacitor 325 is connected between the power source Vdd of the driver IC26 and the ground. The decoupling capacitors 323, 325 arranged as described above allows the LED head 31 to suppress the effect exerted by the noise voltage on the light emission of the LED devices LED1, LED, ..., LED192, and also achieves to make the LED head 31 smaller.

Operation of the printer 1 and the reason why the decoupling capacitors 323, 325 suppresses the effect caused by the noise voltage will be hereinafter described in detail.

When printing is executed, the print control unit 3 alternately inputs the odd-numbered print data and the even-numbered print data to the LED head 31. After the print data is the latched in latch circuits LTA1, LTA2, ..., LTA24, the latch circuit LTB1, LTB2, ..., LTB24, the latch circuits LTC1, LTC2, ..., LTC24, and the latch circuits LTD1, LTD2, ..., LTD24, the print control unit 3 inputs the strobe signal STB-P into the LED head 31, and drives the LED devices LED1, LED2, ..., LED192 while adjusting the light amount of the LED devices LED1, LED2, ..., LED192.

Figure 14:
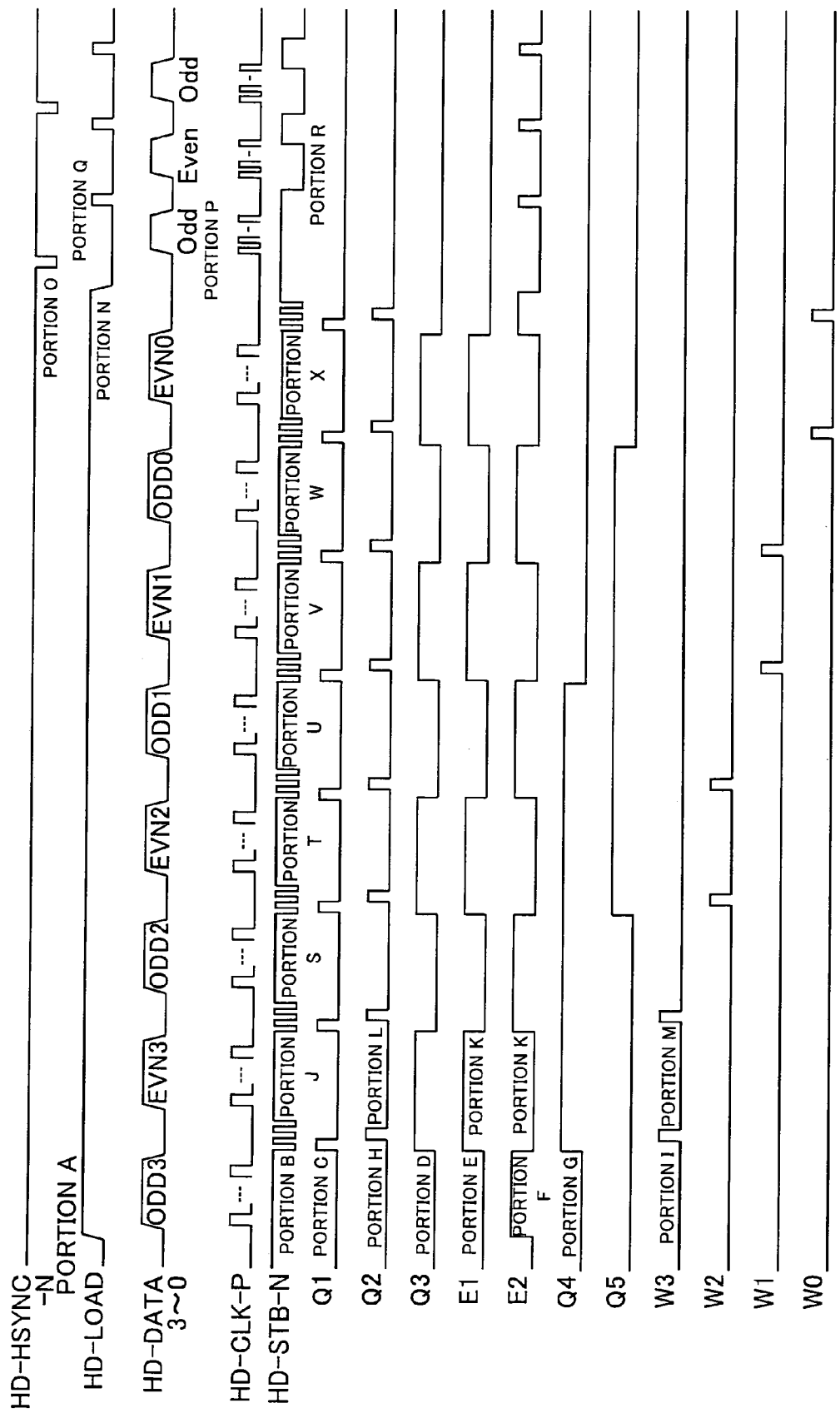
FIG. 14 is a time chart showing operation of the printer.

Specifically, as shown in FIG. 14, the print control unit 3 transits the latch signal HD-LOAD to the high level signal at portion A, before inputting the correction data ODD3, ODD2, ODD1, ODD0 and the correction data EVN3, EVN2, EVN1, EVN0 to the LED head 31. Thus, the LED head 31 can recognize that the correction data ODD3, EVN3, ODD2, EVN2, ODD1, EVN1, ODD0, EVN0 will be subsequently inputted.

In synchronization with the clock signal HD-CLK-P, the print control unit 3 alternately inputs the odd-numbered correction data ODD3, ODD2, ODD1, ODD0 and the even-numbered correction data EVN3, EVN2, EVN1, EVN0 to the LED head 31. Specifically, the print control unit 3 first inputs the correction data signal ODD3 to the LED head 31 in synchronization with the clock signal HD-CLK-P. Then, the correction data signal ODD3 is inputted to the shift register consisting of the flip flop circuit FFA1, FFA2, ..., FFA25, the flip flop circuit FFB1, FFB2, ..., FFB25, the flip flop circuit FFC1, FFC2, ..., FFC25, and the flip flop circuit FFD1, FFD2, ..., FFD25. After the correction data is inputted to the shift register, the print control unit 3 inputs three pulses of the strobe signal HD-STB-P to the LED head 31. When the first pulse of the strobe signal HD-STB-P is inputted to the cell selection circuit 151, the output signal Q1 outputted from the output terminal Q of the flip flop circuit 153 transits to the high level signal at portion C. When the output signal Q1 becomes the high level signal, the output signal Q3 outputted from the output terminal Q of the flip flop circuit 159 transits to the high level signal at portion D. When the output signal Q3 transits to the high level signal and is inputted to the AND circuit 161, the enable signal E1 outputted from the AND circuit 161 transits to the high level signal at portion E and is inputted to the memory cell circuit MEM2. When the output signal Q3 outputted from the output terminal Q of the flip flop circuit 159 transits to the high level signal, the output signal outputted from the output terminal QN of the flip flop circuit 159 and inputted to the AND circuit 163 transits to the low level signal, and the enable signal E2 outputted from the AND circuit 163 transits to the low level signal at portion F. Thus, the memory cell circuit MEM2 becomes ready to store the odd-numbered correction data ODD3. When the output signal of the AND circuit 161 transits to the high level signal and is inputted to the clock terminals of the flip flop circuit 165, 167, the output signal Q4 outputted from the terminal Q of the flip flop circuit 167 transits to the high level signal at portion G. When the second pulse of the strobe signal HD-STB-P is inputted to the cell selection circuit 151, the output signal Q2 outputted from the output terminal Q of the flip flop circuit 155 transits to the high level signal at portion H. The transition of the output signal Q2 to the high level causes the writing control signal W3 outputted from the AND circuit 175 to transit to the high level signal at portion I, because the output signal Q4 outputted from the terminal Q of the flip flop circuit 167 and the output signal outputted from the output terminal QN of the flip flop circuit 165 are maintained to be the high level signal at this moment. When the first pulse of the writing control signal W3 is inputted, the correction data ODD3 is stored in the memory circuit corresponding to the inverters 143, 145.

After the correction data signal EVN3 is inputted to the LED head 31 from the print control unit 3, the cell selection circuit 151 inverts the enable signals E1, E2 at portion K upon the input of the strobe signal HD-STB-P at portion J. Thus, the memory cell circuits become ready to store the even-numbered correction data EVN3. Then, the LED head 31 inputs the second pulse of the writing control signal W3 to the memory circuit storing the correction data EVN3 by changing the output signal Q2 according to the second pulse of the strobe signal HD-STB-P. Thus, the correction data EVN3 is stored in the memory cell circuit 93 of the memory cell circuit MEM2. The printing control circuit 3 and the LED head 31 stores the correction data ODD2, ODD1, ODD0 and the correction data EVN2, EVN1, EVN0 to the memory cell circuit MEM2 by repeating the same processings.

After the odd-numbered correction data ODD3, ODD2, ODD1, ODD0 and the even-numbered correction data EVN3, EVN2, EVN1, EVN3 are stored in the memory cell circuit MEM2, the print control unit transits the latch signal HD-LOAD to the low level signal at portion N. Thereby, the LED head 31 becomes ready for inputting the print data.

Next, the print control unit 3 inputs the main scanning synchronization signal HD-HSYNC-N to the LED head 31 at portion O. Thereby, the LED head 31 can recognize that the odd-numbered print data signal HD-DATA3 to 0 will be subsequently inputted.

In synchronization with the clock signal HD-CLK, the print control unit 3 consecutively inputs the print data signal HD-DATA3 to 0 to the LED head 31. Specifically, at portion P, the print control unit 3 inputs to the LED head 31 the print data corresponding to odd-numbered dots among the print data for the first line. When the input of the print data is completed, the print control unit inputs the latch signal HD-LOAD to the LED head 31 at portion Q. Thus, the print data is sent to and latched in the latch circuit LTA1, LTA2, ..., LTA24, the latch circuit LTB1, LTB2, ..., LTB24, the latch circuit LTC1, LTC2, ..., LTC24, and latch circuit LTD1, LTD2, ..., LTD24. The print control unit 3 inputs the strobe signal HD-STB-N to the LED head 31 at portion R. When the strobe signal HD-STB-N is inputted to the driving circuits DRV, the driving circuits DRV drive the LED devices LED1, LED3, ..., LED191 corresponding to the print data for a period of time when the strobe signal HD-STB-N is maintained to be the low level. The printer 1 forms a latent image by repeatedly executing the operations as described above.

Figure 15:
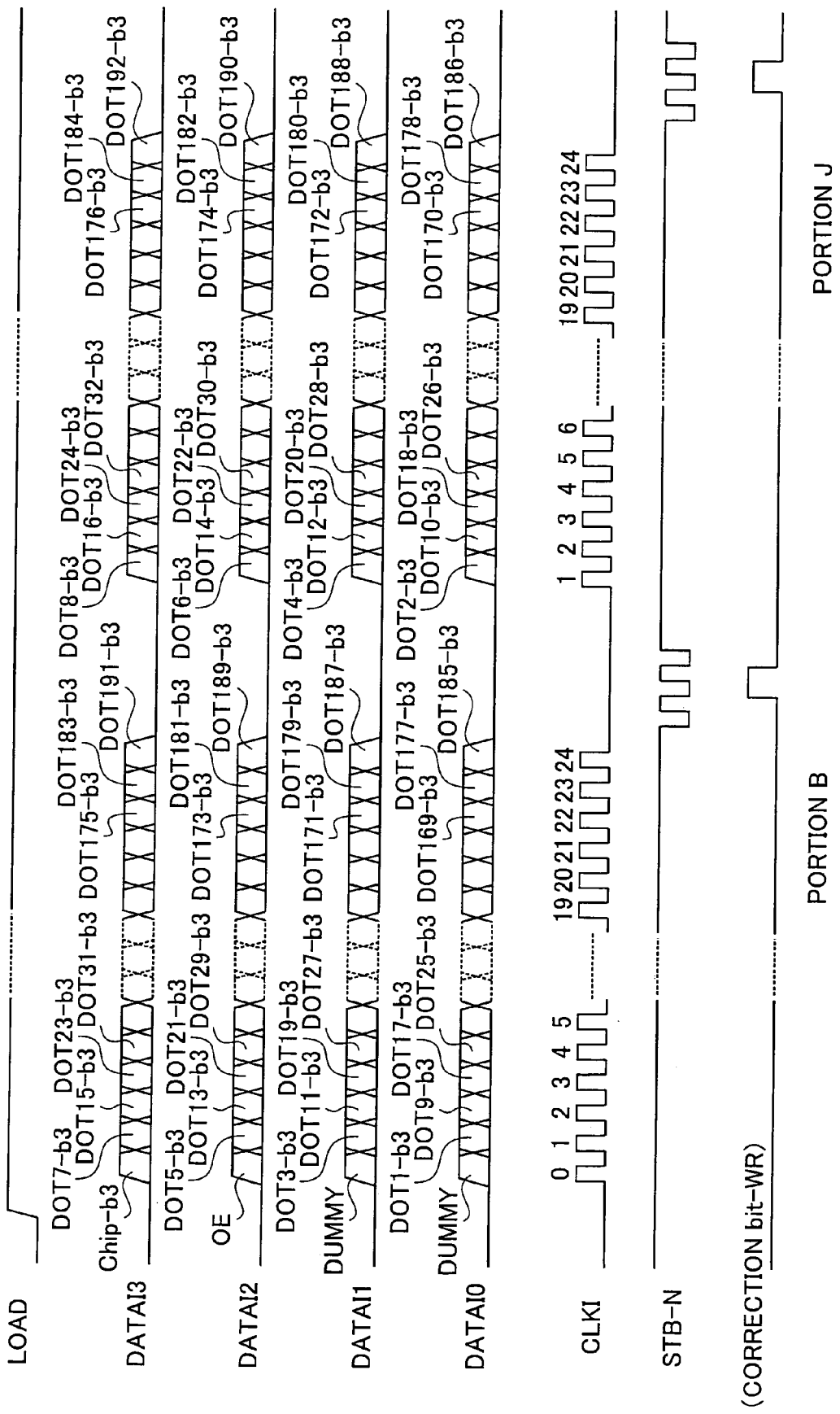
FIG. 15 is an enlarged time chart of an essential portion of the time chart.
Figure 16:
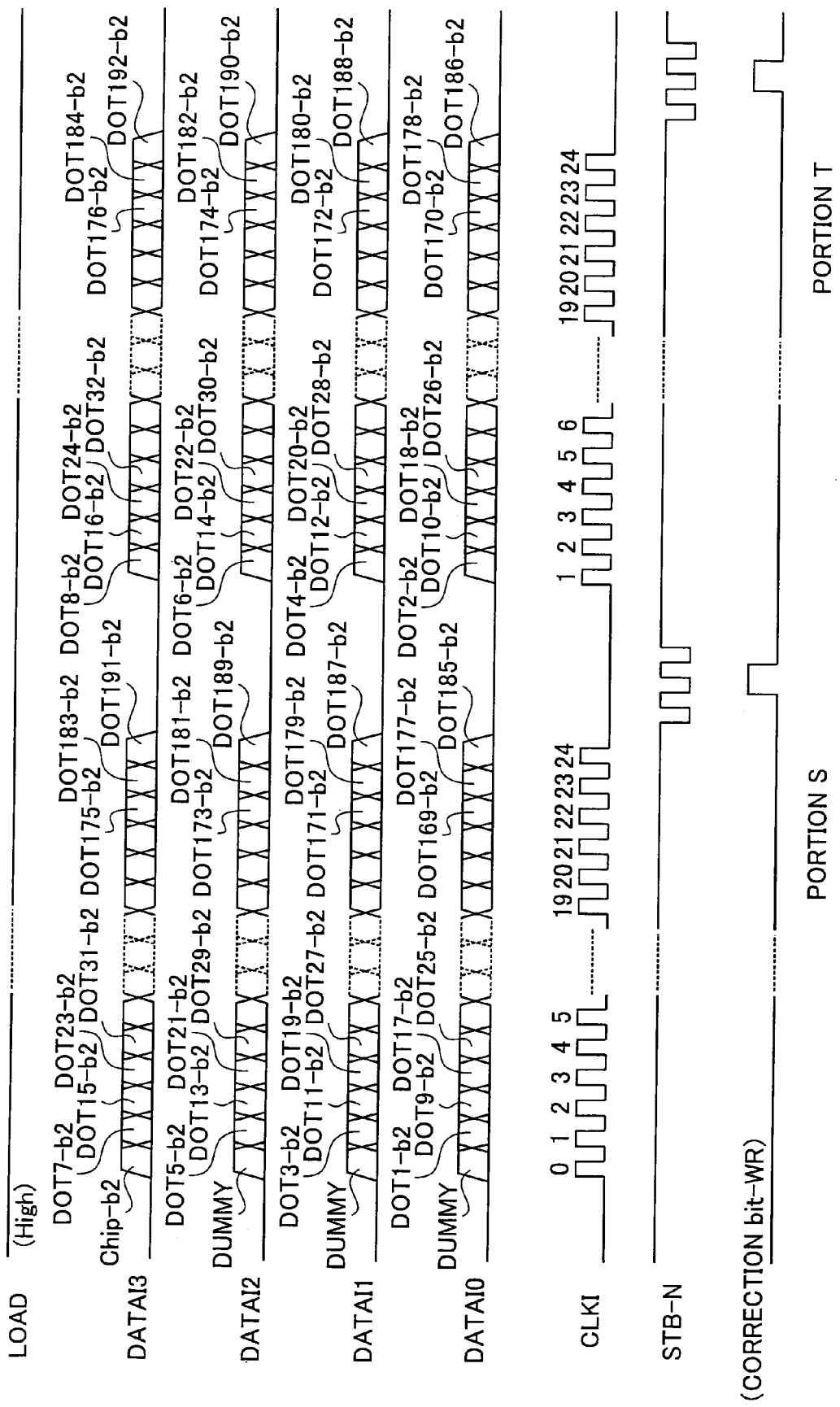
FIG. 16 is an enlarged time chart of an essential portion of the time chart.
Figure 17:
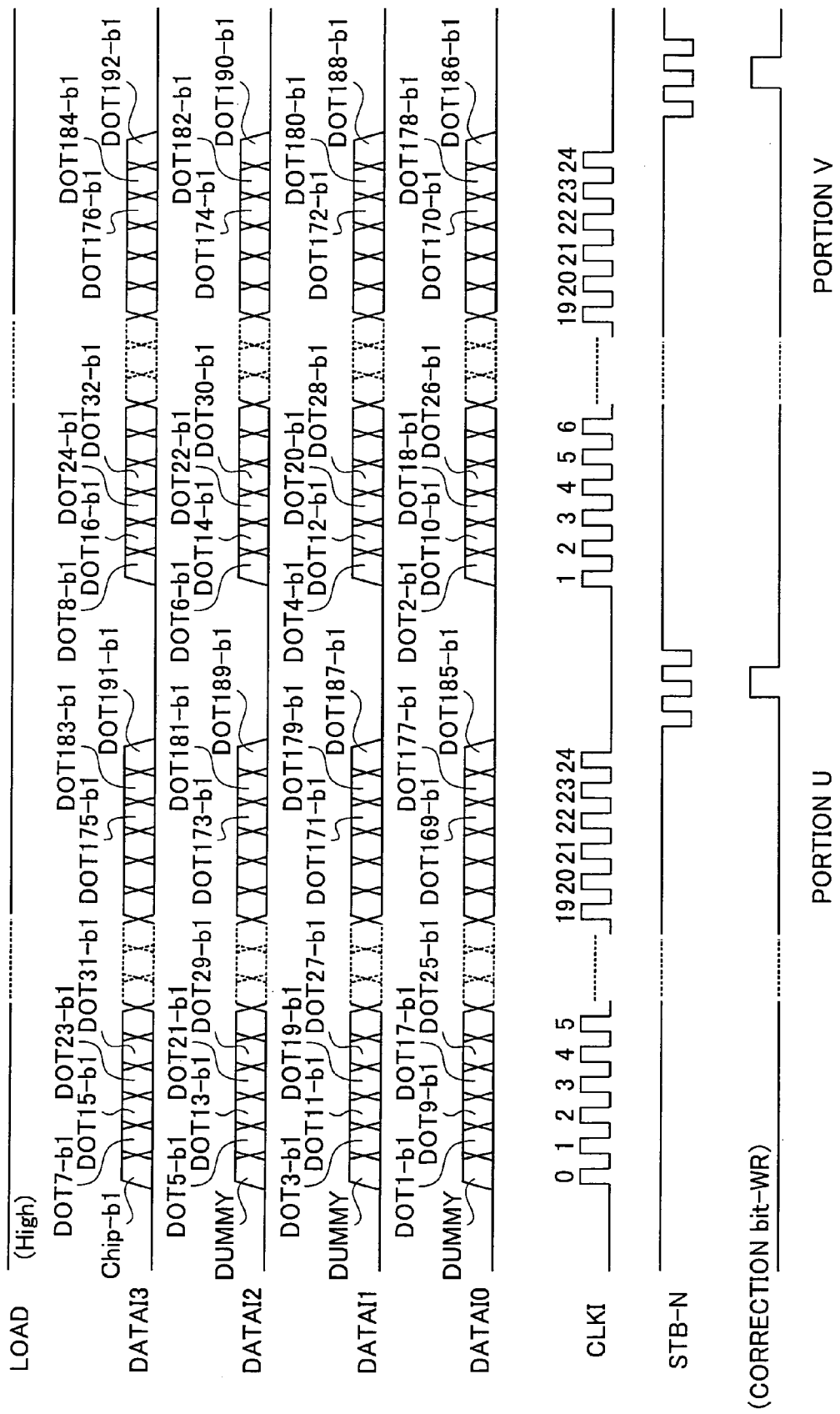
FIG. 17 is an enlarged time chart of an essential portion of the time chart.
Figure 18:
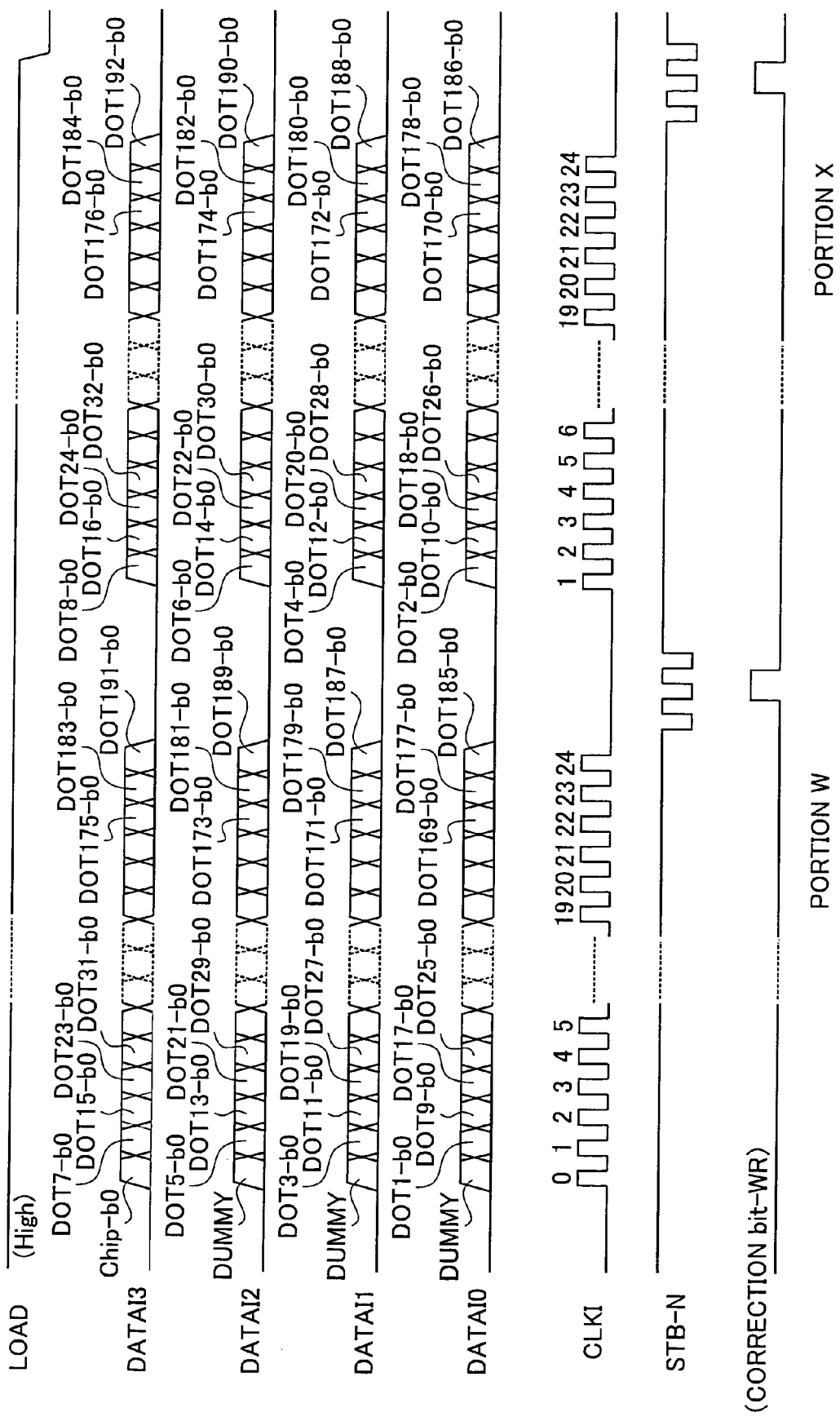
FIG. 18 is an enlarged time chart of an essential portion of the time chart.

The data structure when the correction data ODD3, EVN3 is inputted to the LED head 31 will be hereinafter described specifically in detail with reference to FIG. 15. The data structure when the correction data ODD2, EVN2 is inputted at portion S and portion T will be described in detail with reference to FIG. 16. The data structure when the correction data ODD1, EVN1 is inputted at portion U and portion V will be described in detail with reference to FIG. 17. The data structure when the correction data ODD0, EVN0 is inputted at portion W and portion X will be described in detail with reference to FIG. 18. In FIGS. 15 to 18, only one chip of the driver IC is used in the detailed description for convenience of explanation.

As shown in FIG. 15, chip correction data Chip-b3 is assigned to the head of the odd-numbered correction data inputted to the input terminal DATAI3 at portion B. It should be noted that this kind of the chip correction data is not assigned to the head of the even-numbered correction data inputted to the input terminal DATAI3 at portion J. This is because it is sufficient to provide the chip correction data configured for each driver IC at either one of the odd-numbered or the even-numbered data transfer. Dummy data is assigned to the head of each correction data inputted to the input terminals DATAI1, DATAI0 because the correction data inputted to the input terminals DATAI1, DATAI0 has the structure of 25 rows at portion B at this moment. On the other hand, at portion J, the shift register has the structure of 24 rows due to the switching of the enable signal E2 because the data inputted to each of the input terminals DATAI3 to 0 has the structure of 24 rows.

An OE bit inputted to the latch device 187 is assigned to the head of the correction data inputted to the input terminal DATAI2. When the correction data having the structure of 25 rows is inputted, the cell selection circuit 151 inputs the enable signal E2 to the selector circuit 63, so that the number of rows of the shift register is switched to 25 rows. When the 25th pulse of the clock signal HD-CLK is inputted to the LED head 31 at portion B, the OE bit is inputted to the input terminal D of the latch device 187. If it is assumed that a value "1" is assigned to the OE bit, the OE signal inputted to the analog switch device 291 from the latch device 187 becomes the high level signal, so that the analog switch device 291 becomes conductive between both of the terminals thereof. When the analog switch device 291 becomes conductive between both of the terminals thereof, the reference voltage VREF is supplied from the reference voltage output terminal VREF of the reference voltage generation circuit 261 to the control voltage generation circuit 183 and other driver IC's. On the other hand, in a case where a value "0" is assigned to the OE bit, the OE signal outputted from the output terminal Q of the latch device 187 becomes the low level signal. In this case, the analog switch device 291 becomes non-conductive between both of the terminals thereof. Thus, the driver IC having received the correction data having the value "0" assigned to the OE bit does not generate the reference voltage VREF. The reference voltage VREF supplied from another driver IC having the value "1" assigned to the OE bit is inputted to the control voltage generation circuit 183 of the corresponding driver IC. In this way, the printer 1 assigns the value "1" or the value "0" as the OE bit to the head of the data row of the correction data, and thus is capable of selecting from which driver IC including itself the reference voltage VREF is obtained.

Next, the noise occurring in the LED head is hereinafter described in detail with reference to FIG. 19 for clarifying the effect of the present invention.

Figure 19:
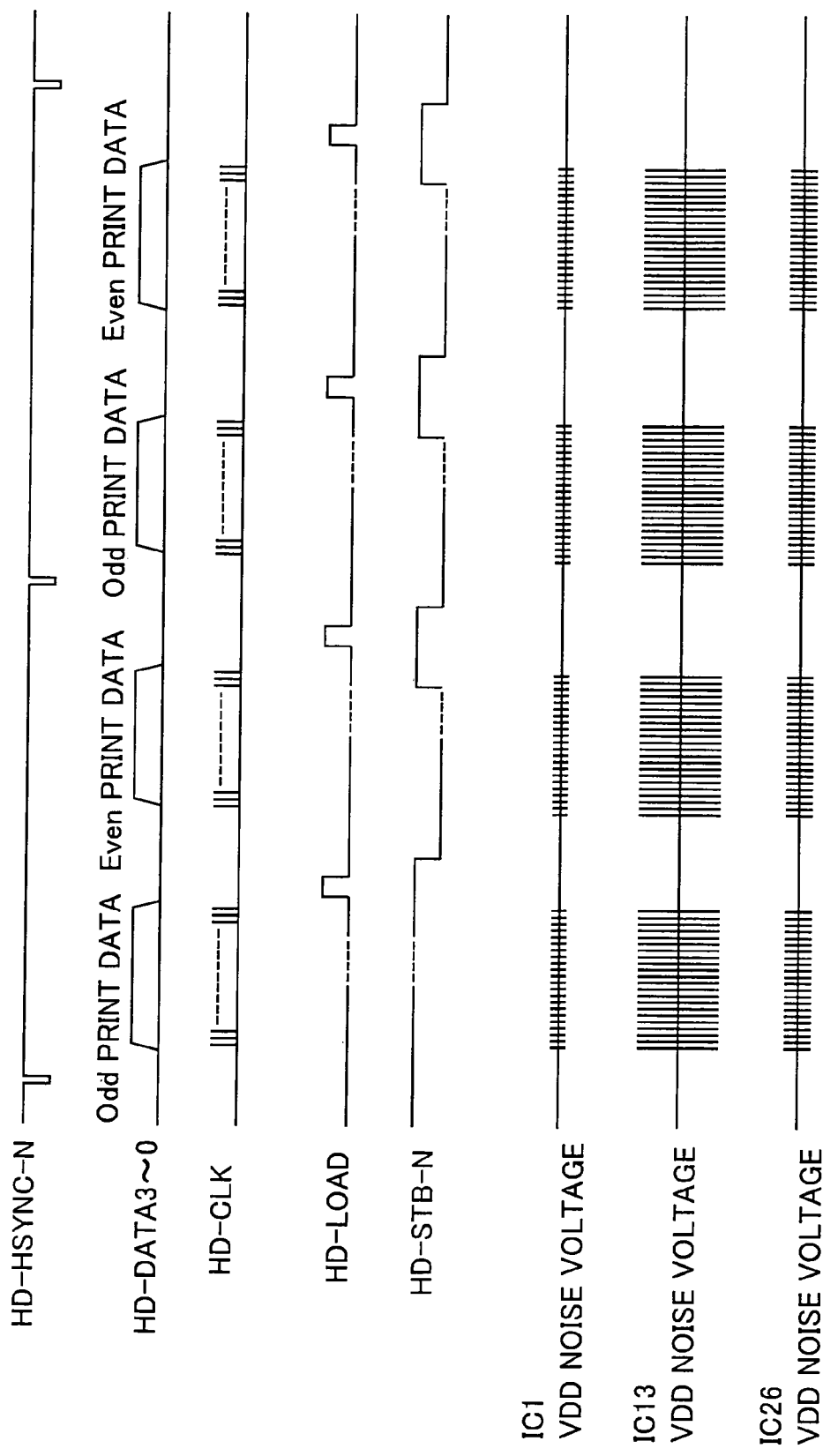
FIG. 19 is a time chart showing operation of the printer and occurrence of noise.

FIG. 19 shows the noise voltage occurring in the power supply Vdd of each of the driver IC's in a case where the control voltage is inputted from the control voltage generation circuit 183 to the driving circuit DRV using the reference voltage VREF generated by the reference voltage generation circuit 261 equipped in itself upon inputting the value "1" as the OE bit to each of the driver IC's in the LED head 31. It should be noted that FIG. 19 shows the noise voltage in a state where the bonding wires shown in FIG. 12 are not connected to the reference voltage output terminals VREF of each of the driver IC's.

As shown in the figure, it can be known that the noise voltage occurring in the power supply Vdd of the driver IC1 arranged in proximity to and connected to the decoupling capacitor 323 and the driver IC26 arranged in proximity to and connected to the decoupling capacitor 325 is less than the noise voltage occurring in the power supply Vdd of the driver IC13 arranged substantially in the middle of the driver IC1 and the driver IC26. This arises from the fact that the magnitude of the noise voltage occurring in the power supply Vdd of each of the drivers IC1, IC2, ..., IC26 increases according to the distance from the connector terminal unit 313 containing the power source terminals or the distance from the decoupling capacitors 323, 325.

The reference voltage output terminals VREF of all of the driver IC's are connected with respect to the LED head 31 as described above. For example, in a case where the correction data having the value "1" as the OE bit is inputted to only the driver IC1 and the correction data having the value "0" as the OE bit is inputted to the other drivers IC2, IC3, ..., IC26, the driver IC1 producing the least noise voltage generates the reference voltage VREF. The reference voltage generated in the driver IC1 is supplied to each of the driver IC2, IC3, ..., IC26 via the reference voltage output terminal VREF.

The printer 1 according to the present invention can switch the supplier of the reference voltage VREF supplied to the control voltage generation circuit 183 using the analog switch device 291, and thereby supplies the reference voltage VREF generated in the driver IC1 having the least noise voltage to the control voltage generation circuit 183 of the other driver IC2, IC3, . . . , IC26. Thus, the noise immunity of the LED head 31 is improved. Such effect can be obtained by arranging at this moment at least one piece of the noise suppressing means such as the decoupling capacitor and the like in proximity to the driver IC nearest to the connector terminal unit 313 containing the power supply terminal. Furthermore, this eliminates the necessity to arrange the decoupling capacitors corresponding to each of the driver IC2, IC3, . . . , IC26, and renders the shorter side length L1 of the LED head 31 shorter than that of the conventional art, thus making the LED head smaller. Accordingly, the number of used decoupling capacitors can be decreased, and the cost of the LED head 31 can be reduced.

The noise voltage can be pleasantly suppressed without enlarging the size of the LED head 31 by arranging the decoupling capacitors 323, 325 at either end of the drivers IC1, IC2, . . . , IC26 arranged as shown in FIG. 11.

The second embodiment of the present invention will be hereinafter described in detail. A printer according to the second embodiment has portions that are the same as the printer 1 as described above. Accordingly, such similar portions are omitted from the detailed description, and only the different portions are described in detail.

In addition to the configuration of the printer 1, the printer according to the second embodiment has a means to stop the generation of the reference voltage VREF by the reference voltage generation circuit.

Figure 20:
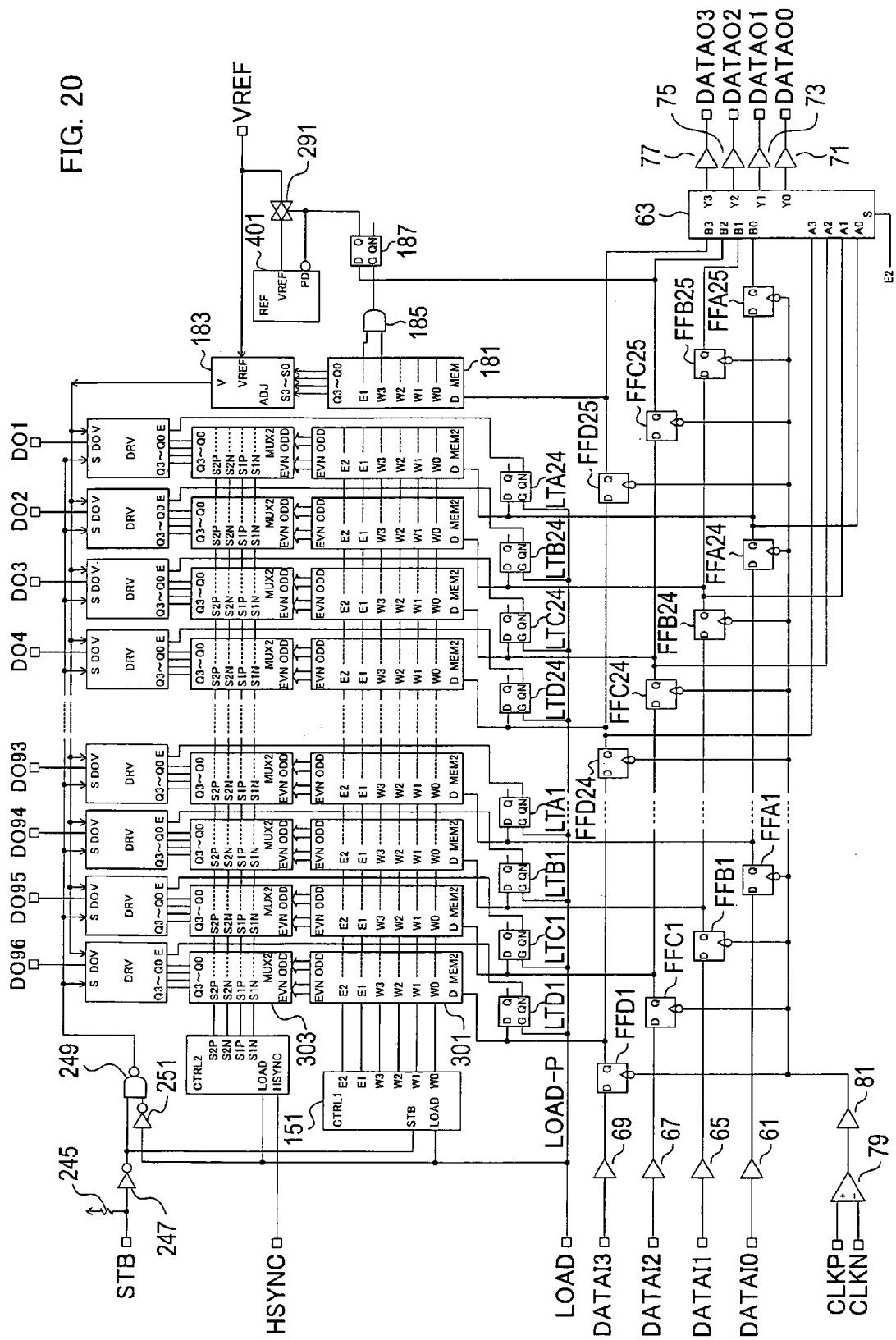
FIG. 20 is a circuit diagram of an LED head according to the second embodiment.

Specifically, as shown in FIG. 20, the driver IC equipped in the printer according to the second embodiment has a reference voltage generation circuit 401 in place of the reference voltage generation circuit 261.

Figure 21:
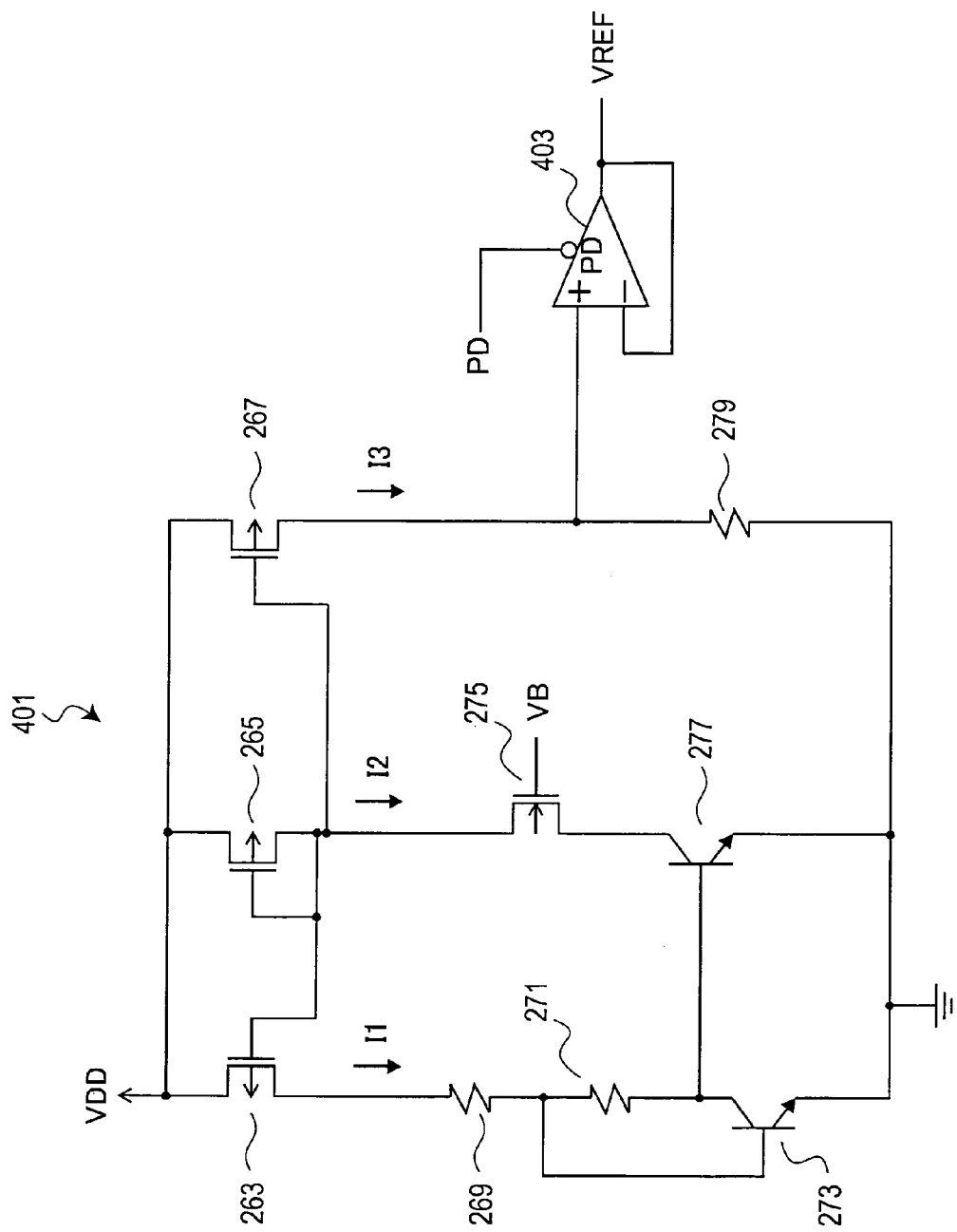
FIG. 21 is a circuit diagram of a reference voltage generation circuit of the LED head.

In addition to the configuration of the reference voltage generation circuit 261 as described above, the reference voltage generation circuit 401 has a power down input terminal PD connected to a operational amplifer 403 as shown in FIG. 21. The power down input terminal PD is connected to the output terminal Q of the latch device 187, and inputs the OE signal from the output terminal of the latch device 187 to the operational amplifer 403. The operational amplifer 403 decreases the power consumption in the reference voltage generation circuit 401 based on the inputted OE signal. In a case where the inputted OE signal is the low level signal, the operational amplifer 403 as described above renders the analog switch device 291 non-conductive between both of the terminals thereof. In a case where the reference voltage VREF should not be supplied from the reference voltage generation circuit 401 to the control voltage generation circuit 183, the operational amplifer 403 suppresses the reference voltage VREF outputted from the reference voltage generation circuit 401. Thus, the power consumption when the reference voltage generation circuit 401 is not operating can be reduced.

Figure 22:
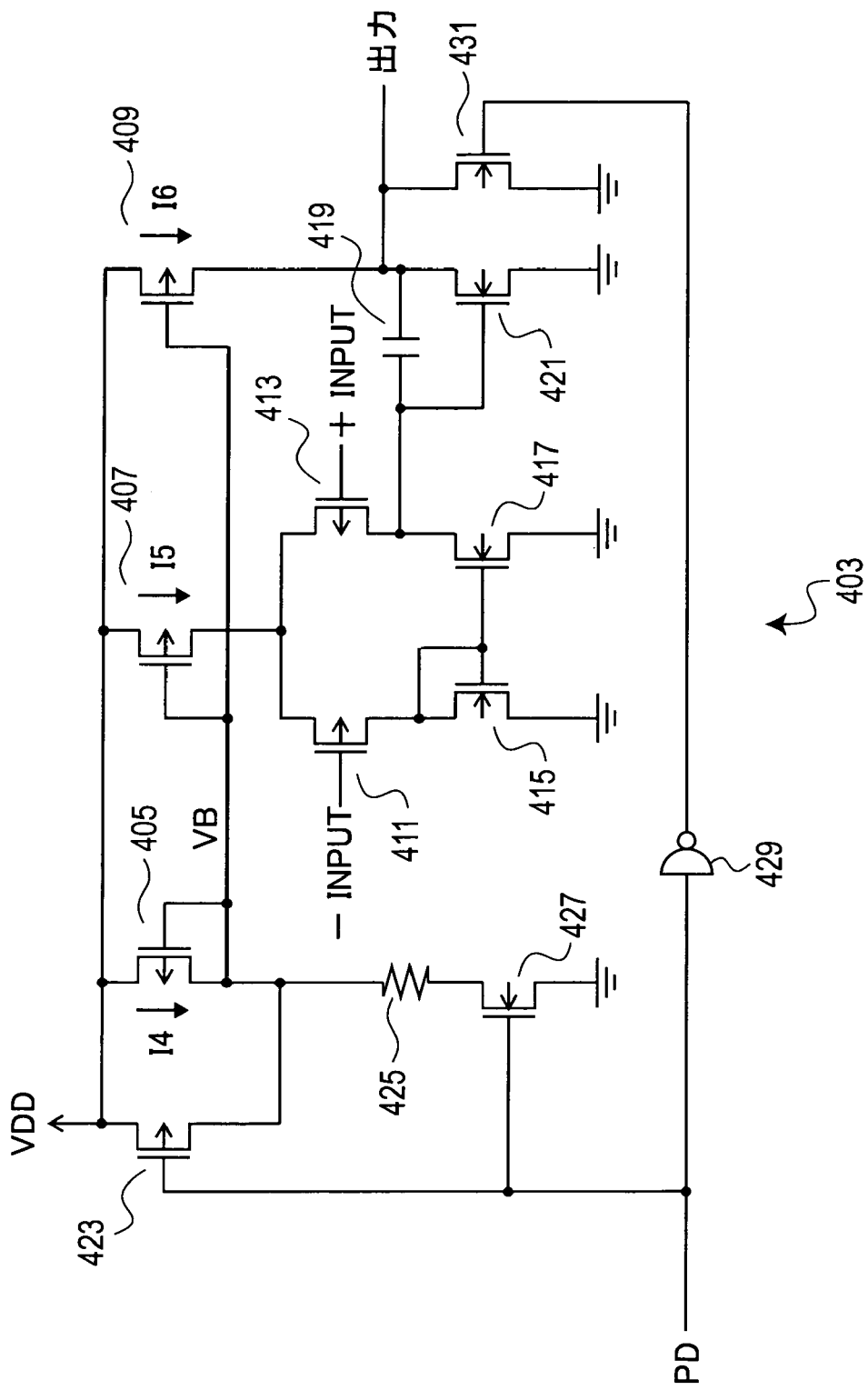
FIG. 22 is a circuit diagram of a operational amplifer of the reference voltage generation circuit.
Figure 23:
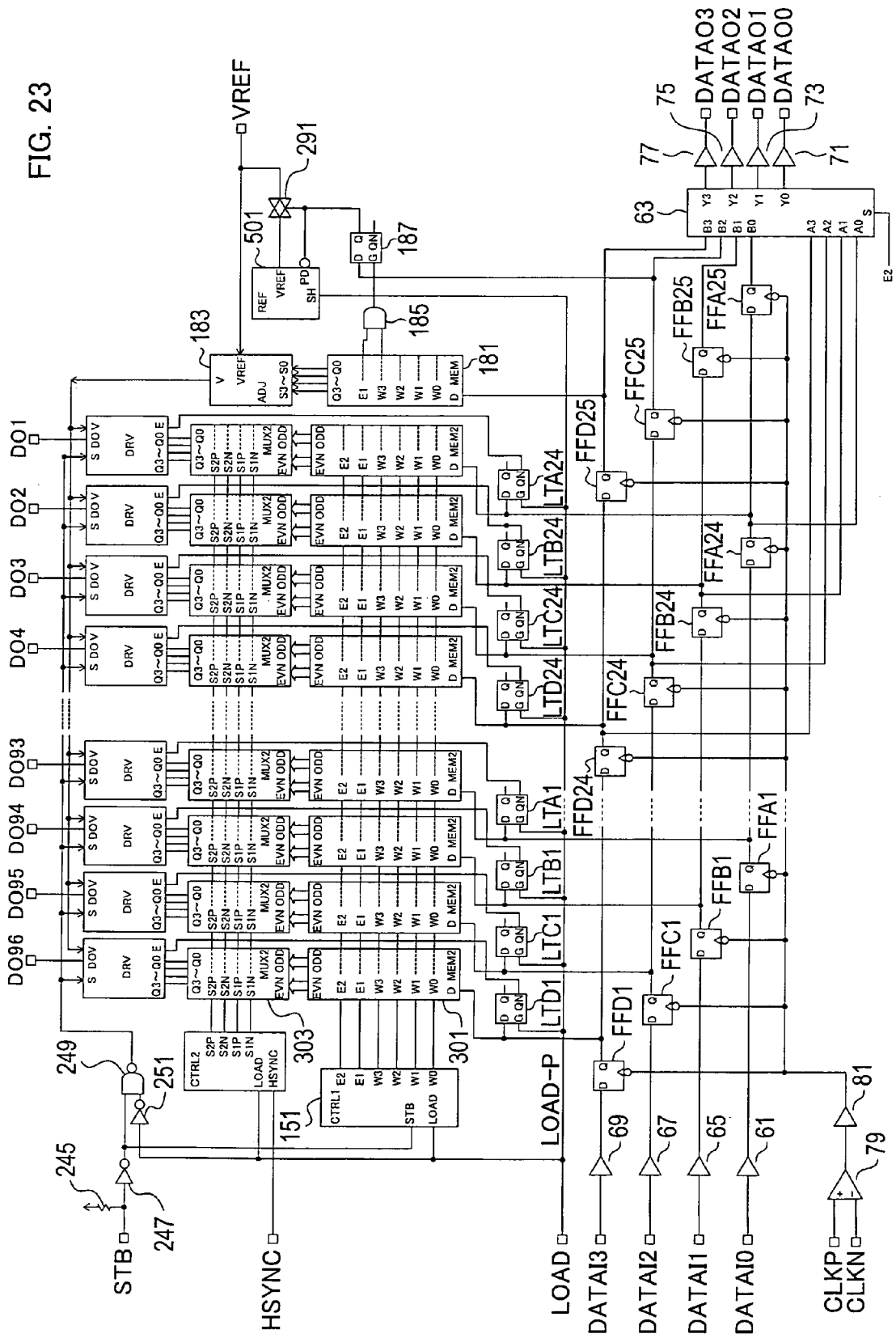
FIG. 23 is a circuit diagram of an LED head according to the third embodiment.

Specifically, as shown in FIG. 22, the source terminal of the operational amplifer 403 is connected to the power supply Vdd, and has p-type MOS transistors 405, 407, 409 whose gates are connected with each other. The operational amplifer 403 has a p-type MOS transistor 411 whose gate is connected to the inversion input terminal, and has a p-type MOS transistor 413 whose gate is connected to the non-inversion input terminal. The source terminals of these p-type MOS transistors 411, 413 are connected to the drain terminal of the p-type MOS transistor 407. The drain terminal of the p-type MOS transistor 411 is connected to the drain terminal of an n-type MOS transistor 415 whose source terminal is connected to the ground. On the other hand, the drain terminal of the p-type MOS transistor 413 is connected to the drain terminal of an n-type MOS transistor 417 whose source terminal is connected to the ground. The gates of the n-type MOS transistor 415 and the n-type MOS transistor 417 are connected with each other, and are connected to the drain terminal of the p-type MOS transistor 411. The drain terminal of the p-type MOS transistor 413 connected to the non-inversion input terminal is connected to one terminal of a capacitor 419, and is connected to an n-type MOS transistor 421 whose drain terminal is connected to the other terminal of the capacitor 419. The drain terminal of the n-type MOS transistor 421 is connected to the drain terminal of the p-type MOS transistor 409. The drain terminal of the p-type MOS transistor 405 is connected to the drain terminal of the p-type MOS transistor 423 driven based on the OE signal inputted from the power down input terminal PD, and is connected to one terminal of a resistor 425. The other terminal of the resistor 425 is connected to the drain terminal of the n-type MOS transistor 427 driven based on the OE signal. The power down input terminal PD is connected to the input terminal of an inverter 429. The output terminal of the inverter 429 is connected to the gate of the n-type MOS transistor 431 connected between the output terminal of the operational amplifer 403 and the ground. In the operational amplifer 403 as described above, a current I4 flows in the p-type MOS transistor 405, a current I5 flows in the p-type MOS transistor 405, and a current I4 flows in the p-type MOS transistor 409.

In a case where the high level signal is inputted as the OE signal to the power down input terminal PD of the operational amplifer 403 as described above, the high level signal is inputted to the gates of the p-type MOS transistor 423 and the n-type MOS transistor 427. Thereby, the p-type MOS transistor 423 becomes non-conductive between the source terminal and the drain terminal, and the n-type MOS transistor 427 becomes conductive between the source terminal and the drain terminal. Because the high level signal is inputted to the input terminal of the inverter 429 at this moment, the low level signal is inputted to the gate of the n-type MOS transistor 431, and the n-type MOS transistor 431 becomes non-conductive between the source terminal and the drain terminal. Thus, the currents I4, I5, I6 flowing in the p-type MOS transistors 405, 407, 409 are kept to be a predetermined value while flowing between the source terminal and the drain terminal, and accordingly, the operational amplifer 403 can output a constant voltage as the reference voltage VREF.

On the other hand, in a case where the low level signal is inputted to the power down input terminal PD, the p-type MOS transistor 423 becomes conductive between the source terminal and the drain terminal, and the n-type MOS transistor 427 becomes non-conductive between the source terminal and the drain terminal. As a result, the voltage between the source terminal and the drain terminal of the p-type MOS transistors 407, 409 becomes approximately 0V, and accordingly, the currents I5, I6 become approximately 0 A. In a case where the n-type MOS transistor 427 becomes non-conductive between the source terminal and the drain terminal, the current I4 becomes approximately 0 A. Because the n-type MOS transistor 431 becomes conductive between the source terminal and the drain terminal at this moment, the reference voltage VREF outputted from the output terminal of the operational amplifer 403 becomes 0V. In this way, the operational amplifer 403 can reduce the consumed current in time to the operation of the analog switch device 291 according to the OE signal driving the analog switch device 291.

In addition to the advantages of the printer 1 as described above, the printer according to the second embodiment has the advantage to transit the state of the reference voltage generation circuit 401 of the driver IC not required to supply the reference voltage VREF to the control voltage generation circuit 183 to the power-down state. Thus, the second embodiment provides the driver IC, the LED head, and the printer excellent in energy-conservation.

The third embodiment of the present invention will be hereinafter described in detail. A printer according to the third embodiment has portions that are the same as the printer according to the second embodiment as described above. Accordingly, such similar portions are omitted from the detailed description, and only the different portions are described in detail.

In addition to the configuration of the printer according to the second embodiment, the printer according to the third embodiment has a reference voltage generation circuit 501 that generates and maintains the reference voltage Vref0 before the noise voltage is generated and that supplies the maintained voltage as the reference voltage VREF to the control voltage generation circuit. In the reference voltage generation circuit 501, the maintained reference voltage VREF is inputted to the control voltage generation circuit 183 based on the latch signal LOAD-P inputted via an input terminal SH.

Figure 24:
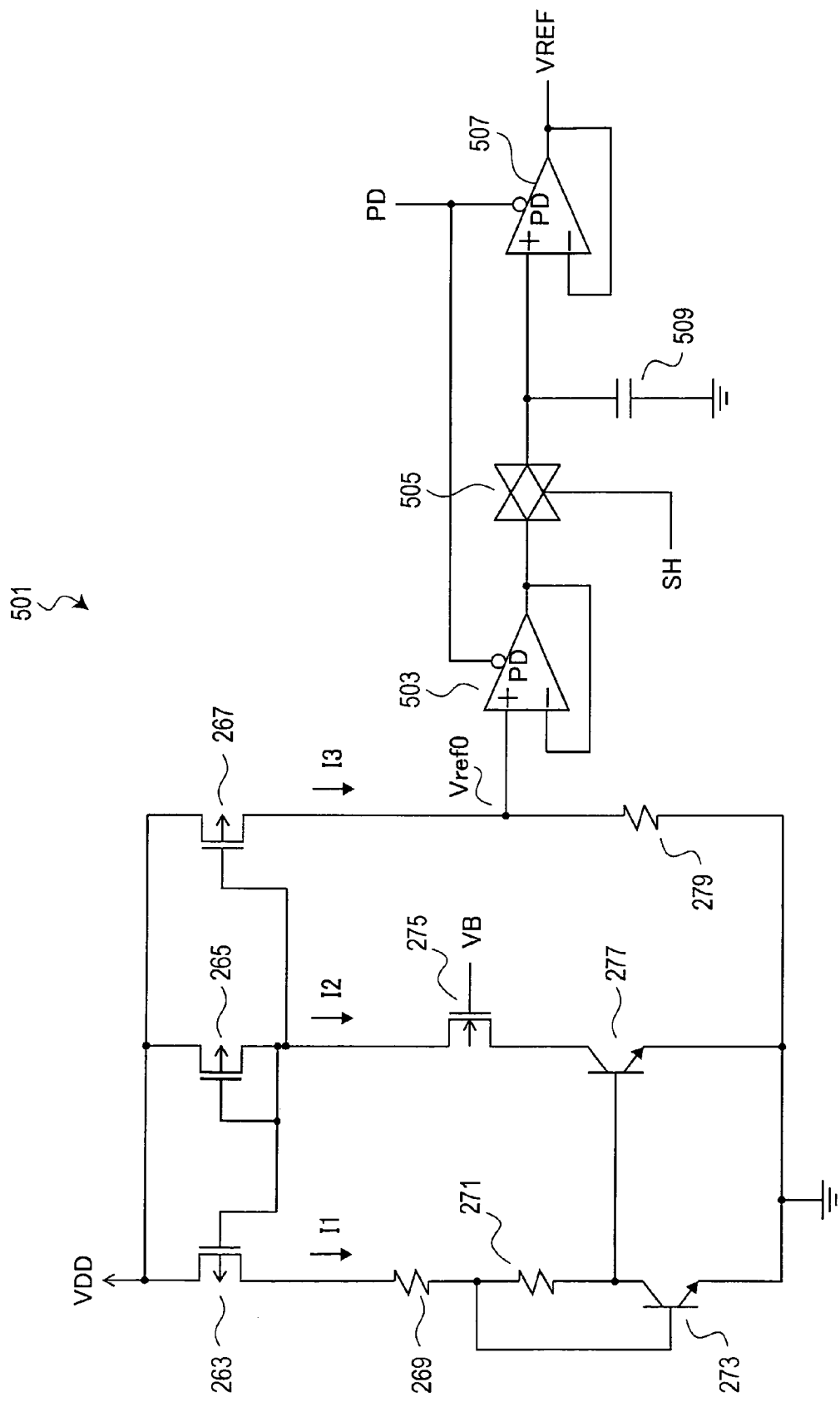
FIG. 24 is a circuit diagram of the reference voltage generation circuit of the LED head.

As shown in FIG. 24, the reference voltage generation circuit 501 has a operational amplifer 503, an analog switch device 505 connected to the input terminal SH, a operational amplifer 507, and a capacitor 509. The reference voltage generation circuit 501 as described above holds the reference voltage VREF outputted from the operational amplifer 503 in the capacitor 509. Then, when the latch signal LOAD-P and the OE signal is inputted to the analog switch device 505, the reference voltage VREF held in the capacitor 509 is outputted.

Specifically, the output terminal of the operational amplifer 503 is connected to the inversion input terminal of itself, and is also connected to one terminal of the analog switch device 505. The operational amplifer 503 has the same structure as the above-described operational amplifer 403, and operates based on the inputted OE signal. The output result of the operational amplifer 503 is inputted to the analog switch device 505.

The analog switch device 505 is connected to the input terminal SH into which the latch signal LOAD-P is inputted. Furthermore, the other terminal of the analog switch device 505 is connected to the capacitor 509. When the analog switch device 505 is conductive between both of the terminals, the output voltage of the operational amplifer 503 is held in the capacitor 509. The capacitor 509 is connected to the non-inversion input terminal of the operational amplifer 507.

The operational amplifer 507 constitutes the voltage follower circuit just like the operational amplifer 403, and has the same configuration as the operational amplifer 403. When the OE signal is inputted, the operational amplifer 507 outputs the reference voltage Vref0 held in the capacitor 509 to the output terminal as the reference voltage VREF, and supplies the reference voltage VREF to the control voltage generation circuit 183.

The capacitor 509 may be formed within the driver IC using semiconductor production process. Alternatively, the capacitor 509 may be arranged as a separate part, whose connection nodes are connected to electrode pads arranged on the driver IC. By arranging the capacitor 509 as a separate part external to the driver IC, the driver IC is prevented from restricted by the capacity limitation occurring in the semiconductor production process. By making the capacity of the capacitor equal to or more than a certain amount, the output voltage can be stably maintained even in a case where the noise voltage occurs in the drive IC.

In a case where the high level signal is inputted to the input terminal SH in the reference voltage generation circuit 501 when the OE signal is at high level, the analog switch device 505 becomes conductive between both of the terminals. The reference voltage Vref0 generated at one terminal of the resistor 279 is outputted from the operational amplifer 503, and is supplied to the capacitor 509 via the analog switch device 505. The capacitor is charged by the supplied reference voltage Vref0. The output voltage of the capacitor 509 is supplied to the operational amplifer 507. While the latch signal LOAD-P is inputted to the input terminal SH, the reference voltage Vref0 is continued to be applied to the capacitor 509, and the potential of the capacitor 509 follows.

On the other hand, when the low level signal is inputted to the input terminal SH, the analog switch device 505 becomes non-conductive between both of the terminals thereof. Thereby, the reference voltage Vref0 is not supplied to the circuits further than the calculation amplification circuit 503. At this moment, the capacitor 509 holds the potential corresponding to the reference voltage Vref0 that is charged right before the analog switch device 505 becomes non-conductive. The reference voltage Vref0 as described above is inputted to the voltage follower circuit constituted by the operational amplifer 507, and the reference voltage generation circuit 501 supplies the reference voltage VREF to the control voltage generation circuit 183.

Figure 25:
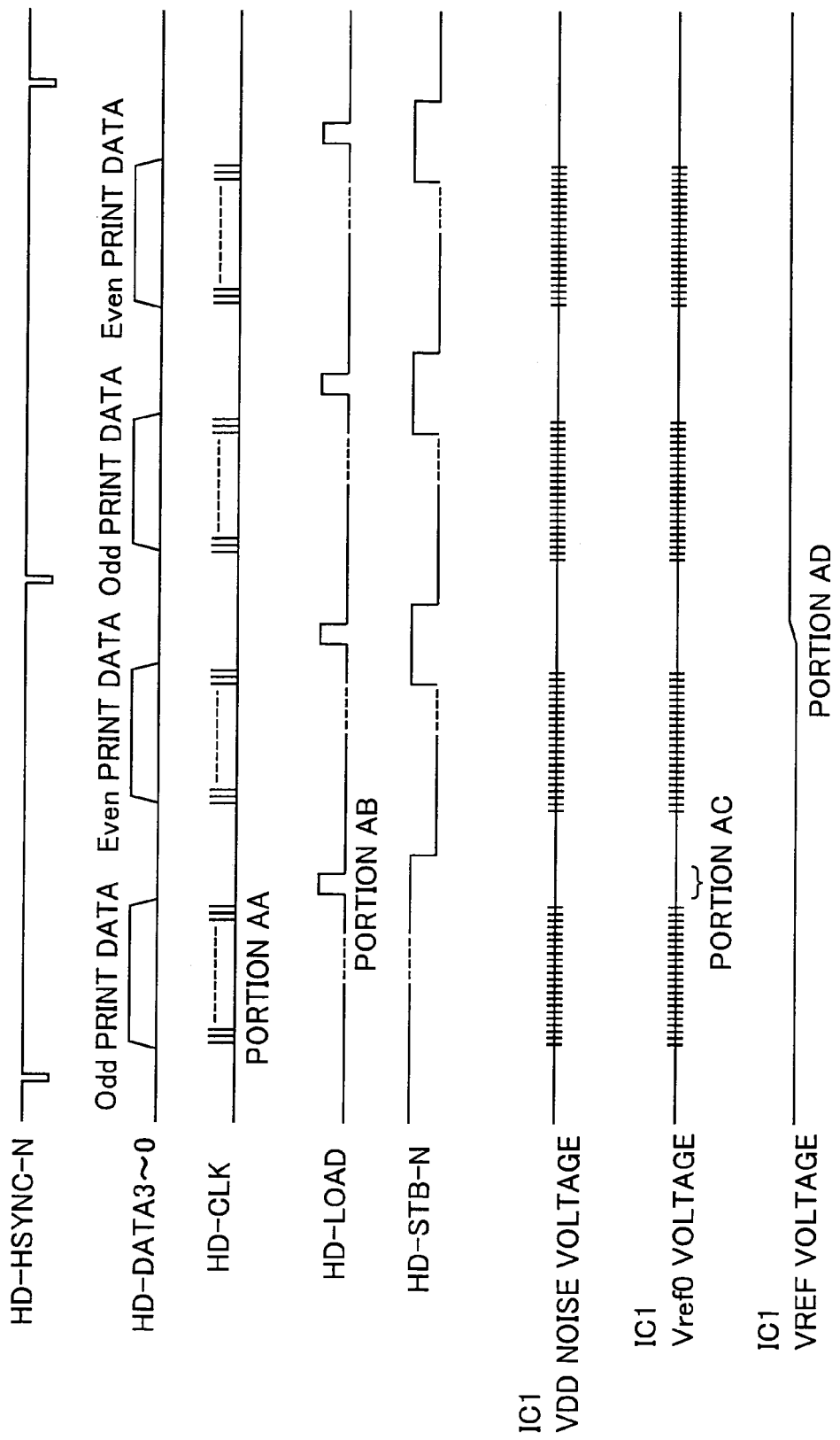
FIG. 25 is a time chart showing operation of the printer according to the third embodiment and occurrence of noise.
Figure 26:
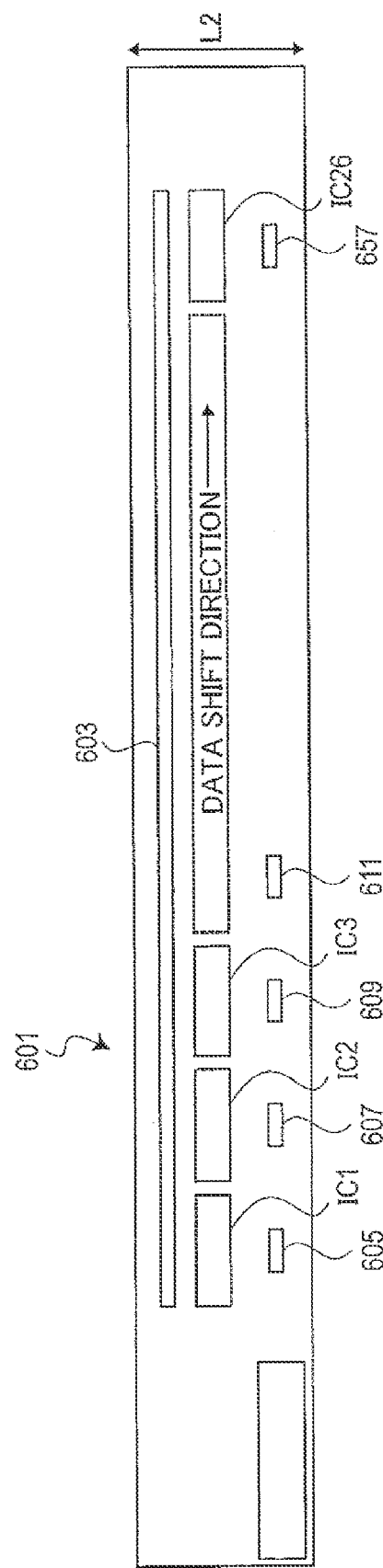
FIG. 26 is a plan view of a conventionally-used LED head.

As shown in FIG. 25, the noise voltage in the Vdd power supply occurs when the shift register is driven by the clock signal HD-CLK, namely, at the time of the shifting of the print data signal HD-DATA3 to 0 as shown in AA portion. If the reference voltage VREF is attempted to be generated at the time of the shifting of the print data signal HD-DATA3 to 0, the noise voltage necessarily occurs in the voltage.

On the other hand, in a case where the reference voltage generation circuit 501 is used, the reference voltage VREF is supplied from the reference voltage generation circuit 501 to the control voltage generation circuit 183 at the time of the latching of the print data signal HD-DATA3 to 0 after the transfer of the print data signal HD-DATA3 to 0. That is, when the print data signal HD-DATA3 to 0 is stored in the shift register, the print control unit 3 generates the latch signal LOAD-P for stopping the clock signal HD-CLK and for latching the print data signal HD-DATA3 to 0 as shown in portion AB. The reference voltage generation circuit 501 inputs the reference voltage VREF to the control voltage generation circuit 183 based on the latch signal LOAD-P inputted to the input terminal SH at the time as described above. At this time, data transfer in the driver IC has not yet been done due to the halt of the clock signal HD-CLK, and the noise voltage is not occurring in the reference voltage Vref0 inputted to the operational amplifer 507 as shown in portion AC.

There exists a certain time interval between the generation of the reference voltage Vref0 and the generation of the reference voltage VREF, but such interval is quite small, and the temperature of the driver IC detected in the npn transistors 273, 277 is corrected by the re-detection as shown in portion AD, and accordingly, the effected exerted on the reference voltage VREF is quite small. Furthermore, the potential charged in the capacitor 509 is slowly discharged through a leak current, but a discharging time constant is sufficiently large compared with a transfer cycle of the print data signal HD-DATA3 to 0. Thus, such change of the potential hardly affect the generation of the control voltage.

In addition to the advantages of the printer according to the first embodiment and the printer according to the second embodiment as described above, the printer according to the third embodiment has the advantage to detect the chip temperature at the time when the noise voltage is still low, and to hold that value, thus capable of further reducing the influence caused by the noise voltage.

It should be noted that the present invention is not limited to the embodiments as described above, and can be changed as necessary as long as each configuration does not deviate from the gist of the present invention.

Specifically, in the detailed description of the above embodiments, the driving circuits for the LED elements LED1, LED2, ..., LED192 in the electrophotographic printer are taken as examples of the driving circuits, and the LED head is taken as an example of the driving apparatus. However, the purpose of the present invention is to reduce the noise voltage when data is transferred between multiple IC's connected with each other. Thus, for example, the present invention may be applied to a heat element in a thermal printer and to various driving circuits or driving apparatuses used for display apparatuses such as a liquid crystal panel and the like.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention should not be limited by the specification, but be defined by the claims set forth below.

What is claimed is:

1. A driving apparatus comprising a plurality of driving circuits formed to correspond to a plurality of driven circuits arranged on a predetermined circuit board, each of the plurality of driving circuits including:
   a driving control unit for driving a corresponding driven circuit;
   a reference voltage generation unit for generating a reference voltage according to a temperature of the corresponding driven circuit;
   a control voltage generation unit for generating, based on the reference voltage supplied from the reference voltage generation unit, a control voltage for driving the corresponding driven circuit, the control voltage generation unit supplying the generated control voltage to the driving control unit;
   a switch device formed between the control voltage generation unit and the reference voltage generation unit; and
   a switch control unit for driving the switch device based on an inputted control signal,
   wherein the control voltage generation unit is connected to the reference voltage generation unit of another driving circuit via the switch device.

2. The driving apparatus according to claim 1 further comprising:
   a connector unit for connecting an external power supply with the reference voltage generation unit of the any one of the plurality of driving circuits; and
   a noise voltage suppressing unit connected to the driving circuit arranged closest to the connector unit on the circuit board.

3. The driving apparatus according to claim 2, wherein the noise voltage suppressing unit is a decoupling capacitor.

4. The driving apparatus according to claim 2, wherein the circuit board is formed in a substantially rectangular shape,
   and wherein the plurality of driving circuits are arranged along a longitudinal direction of the circuit board,
   and wherein the connector is formed in proximity to one end of an array formed by the plurality of driving circuits,
   and wherein the noise voltage suppressing unit is connected to one end of the plurality of driving circuits arranged at the one of the array.

5. The driving apparatus according to claim 1 further comprising:
   a power consumption reducing unit for reducing power consumption in the reference voltage generation unit when a conducting state between the control voltage generation unit and the reference voltage generation unit is non-conductive.

6. The driving apparatus according to claim 5,
   wherein the power consumption reducing unit reduces the power consumption in the reference voltage generation unit according to the control signal inputted to the switch control unit.

7. The driving apparatus according to claim 1 further comprising:
   a reference voltage holding unit for holding the reference voltage generated in the reference voltage generation unit at a time when the noise voltage does not occur,
   wherein the control voltage generation unit generates the control voltage based on the reference voltage held in the reference voltage holding unit.

8. The driving apparatus according to claim 1,
   wherein each driving circuit further including:
   a reference voltage holding unit for holding the reference voltage generated in the reference voltage generation unit at a time when the noise voltage does not occur,
   wherein the control voltage generation unit generates the control voltage based on the reference voltage held in the reference voltage holding unit.

9. The driving apparatus according to claim 8,
   wherein the reference voltage holding unit holds the reference voltage in a capacitor.

10. A driving circuit comprising:
    a driving control unit for driving a driven device;
    a reference voltage generation unit for generating a reference voltage according to a temperature of the driven device;
    a control voltage generation unit for generating a control voltage for driving the driven device based on the reference voltage supplied by the reference voltage generation unit or based on an externally-supplied reference voltage, the control voltage generation unit supplying the generated control voltage to the driving control unit;
    a switch device formed between the control voltage generation unit and the reference voltage generation unit; and
    a switch control unit for driving the switch device based on an inputted control signal,
    wherein the control voltage generation unit is connected to a supplier of the externally-supplied reference voltage via the switch device.

11. The driving circuit according to claim 10,
    wherein where a noise voltage does not occur in the reference voltage generation unit, the switch device is controlled to become conductive between the control voltage generation unit and the reference voltage generation unit, so that the reference voltage generated by the reference voltage generation unit is supplied to the control voltage generation unit.

12. The driving circuit according to claim 10, wherein where a noise voltage occurs in the reference voltage generation unit, the switch device is controlled to become non-conductive between the control voltage generation unit and the reference voltage generation unit, so that the reference voltage generated by the supplier of the externally-supplied reference voltage is supplied to the control voltage generation unit.

13. An LED head comprising a plurality of driving circuits formed to correspond to a plurality of LED arrays formed on a predetermined circuit board, each of the plurality of driving circuits including:
   a driving control unit for driving a corresponding one of the plurality of LED arrays;
   a reference voltage generation unit for generating a reference voltage according to a temperature of the corresponding one of the plurality of LED arrays;
   a control voltage generation unit for generating a control voltage for driving the corresponding one of the plurality of LED arrays based on the reference voltage supplied by the reference voltage generation unit, the control voltage generation unit supplying the generated control voltage to the driving control unit;
   a switch device formed between the control voltage generation unit and the reference voltage generation unit; and
   a switch control unit for driving the switch device based on an inputted control signal,
   wherein the control voltage generation unit is connected to the reference voltage generation unit of another of the plurality of driving circuits via the switch device.

14. An image forming apparatus comprising:
   an LED head having a plurality of driving circuits formed to correspond to a plurality of LED arrays formed on a predetermined circuit board, and
   a print control unit for inputting a print data signal to any one of the plurality of driving circuits, each of the plurality of driving circuits including:
   a driving control unit for driving a corresponding one of the plurality of LED arrays;
   a reference voltage generation unit for generating a reference voltage according to a temperature of the corresponding one of the plurality of LED arrays;
   a control voltage generation unit for generating a control voltage for driving the corresponding one of the plurality of LED arrays based on the reference voltage supplied by the reference voltage generation unit, the control voltage generation unit supplying the generated control voltage to the driving control unit;
   a switch device formed between the control voltage generation unit and the reference voltage generation unit; and
   a switch control unit for driving the switch device based on a control signal for causing conductivity between the control voltage generation unit and the reference voltage generation unit,
   wherein the control voltage generation unit is connected to the reference voltage generation unit of another of the plurality of driving circuits via the switch device,
   and wherein the print control unit inputs the control signal to the switch control unit of at least one of the plurality of driving circuits.

15. The image forming apparatus according to claim 14, wherein the LED head has:
   a connecter unit for connecting an external power supply with the reference voltage generation unit of any one of the plurality of driving circuits formed on the circuit board; and
   a noise voltage suppressing unit connected to one of the plurality of driving circuits arranged closest to the connector unit on the circuit board,
   wherein the print control unit inputs the control signal to the switch control unit of the one of the plurality of driving circuits connected to the noise voltage control unit.

16. The image forming apparatus according to claim 14, wherein the control signal is assigned to a data row of a correction data signal for correcting a light amount of an LED device constituting the LED array.

* * * * *